[19] United States Patent
Gupta et al.

(10) Patent No.: US 11,804,262 B2
(45) Date of Patent: Oct. 31, 2023

(54) AREA EFFICIENT MEMORY CELL READ DISTURB MITIGATION

(71) Applicant: NVIDIA Corp., Santa Clara, CA (US)

(72) Inventors: Lalit Gupta, Fremont, CA (US); Andreas Jon Gotterba, Santa Clara, CA (US); Jesse Wang, Santa Clara, CA (US); Stefan P Sywyk, San Jose, CA (US)

(73) Assignee: NVIDIA CORP., Santa Clara, CA (US)

(*) Notice: Subject to any disclaimer, the term of this patent is extended or adjusted under 35 U.S.C. 154(b) by 0 days.

(21) Appl. No.: 17/350,973

(22) Filed: Jun. 17, 2021

(65) Prior Publication Data

US 2022/0406371 A1 Dec. 22, 2022

(51) Int. Cl.
G11C 8/08 (2006.01)
G11C 11/418 (2006.01)

(52) U.S. Cl.
CPC .................. G11C 11/418 (2013.01)

(58) Field of Classification Search
CPC .................................................. G11C 11/418
See application file for complete search history.

(56) References Cited

U.S. PATENT DOCUMENTS

| 10,541,013 | B1* | 1/2020 | Schreiber | G11C 8/08 |
| 2019/0080736 | A1* | 3/2019 | Baeck | G11C 5/14 |
| 2021/0027829 | A1* | 1/2021 | Kim | G11C 11/5678 |
| 2022/0068351 | A1* | 3/2022 | Shirako | G11C 8/08 |
| 2022/0148642 | A1* | 5/2022 | Lovett | G11C 11/4085 |

FOREIGN PATENT DOCUMENTS

| CN | 105895160 A | 8/2016 |
| CN | 111279418 A | 6/2020 |
| CN | 111755048 A | 10/2020 |
| CN | 112309463 A | 2/2021 |
| DE | 102011054749 A1 | 4/2012 |
| DE | 102018114250 A1 | 3/2019 |

* cited by examiner

Primary Examiner — Min Huang
(74) Attorney, Agent, or Firm — Rowan TELS LLC

(57) ABSTRACT

A machine memory includes multiple memory cells. Word lines, each with at least one word line driver, are coupled to the memory cells along rows. The word line drivers of at least some adjacent pairs of the word lines are coupled together by a pull-down transistor, in a manner that reduces read disturb of the memory cells.

16 Claims, 15 Drawing Sheets

AREA EFFICIENT MEMORY CELL READ DISTURB MITIGATION

BACKGROUND

Read disturb is a well-known problem in machine memory implementations. As machine memories become more dense and utilize lower voltages than in the past, the mitigation of read disturb becomes an issue of greater interest. Conventional techniques to mitigate read disturb may utilize shunt transistors on the word line driver circuits. However these approaches have known limitations that make them unreliable or less effective in some circumstances, including process, temperature, and voltage variations.

For example, conventional six-transistor (6T) based SRAM exhibits READ and WRITE operational deficiencies, and also exhibits a "half-select" issue in the sub-threshold regime. When reading a 6T cell, the data '0' storage node rises to a certain voltage higher than the ground, according to the voltage dividing across the access transistor and the drive transistor. This can cause read failure as well as write half-select disturbance. Also, due to aggressively reduced voltage, it cannot flip easily the value of the data storage node during WRITE access.

At the start of a READ operation (selected and unselected column), WRITE operation (unselected column), or WRITE MASK operation on a 6T cell, or during a WRITE operation on an eight-transistor (8T) cell, the bit line floats (i.e. is charged to VDD) and the word line is turned ON. This disturbs the cell which can flip the data in cell and hence corrupt the memory. A technique to correct this sometimes called "word line lowering" involves adding a pull-down transistor on the word line. Drawbacks of word line lowering are increased memory circuit area and the need to configure different pull-down strengths from an external chip interface to selectively vary the word line lowering strength based on design requirements.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A pull-down transistor may be shared between two word lines. The pull-down transistor tracks operational changes—e.g., process/voltage/temperature (PVT) variations—of the word line drivers. For example if a word line driver (e.g., an inverter) for one of the word lines gets faster over time, the pull-down transistor may also react faster when the word line is asserted to provide a discharging path for the word line. This may reduce stability problems when reading or writing memory cells on the word lines.

Embodiments in accordance with these features may exhibit substantial circuit area reductions over conventional word line lowering approaches, and may exhibit improvements in manufacturing yield due to reduced read disturb effects. Another advantage of the described approaches is process tracking. When a word line driver drifts toward faster operation, it may increase read disturb effects in coupled cells. In this case the pull-down transistors coupled to the word line may also respond faster, regardless of whether the variation is local or global. Yet another advantage is sharing the OD with the word line driver.

Herein, the term 'full-selected cell' refers to a memory cell with both the word line and bit line selected, i.e. activated or asserted. The term 'half-selected cell' is one for which the word line is selected but the bit line is not selected. A half-selected cell may be subject to a 'parasitic read' meaning the cell is somewhat excited by the asserted word line causing parasitic capacitances in the cell to disturb the stored value. In many machine memory cell implementations, any cell sharing a same word line with a full-selected cell may be half-selected during READ and WRITE operations. The term 'read disturb' should be understood to mean disturbing the stored value in a memory cell while performing an access (READ or WRITE) to the cell or a different memory cell, where a memory cell is any circuit that stores a binary value.

Figure 1:
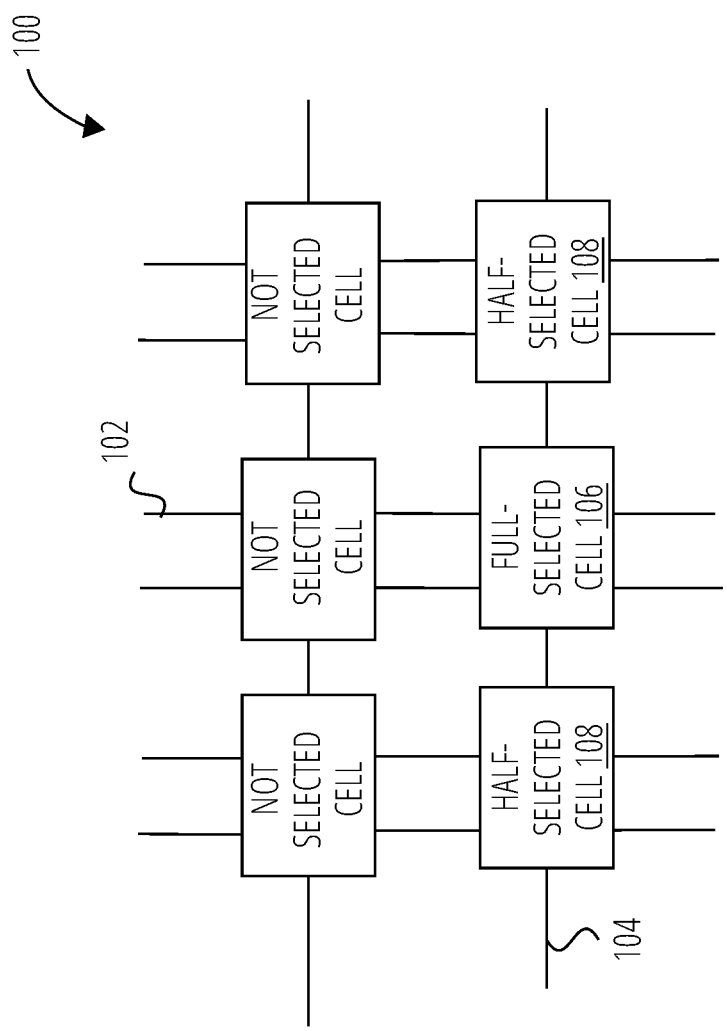
FIG. 1 depicts memory cells 100 in accordance with one embodiment.

FIG. 1 depicts memory cells 100 in a machine memory circuit in one embodiment. The memory cells 100 may utilize a six- or eight- transistor technology, for example. Vertical lines represent bit lines 102 and horizontal lines represent word lines 104. In this example the word line WL(n−1) is selected, meaning activated to perform a memory operation on one of the cells along the word line. The bit lines for full-selected cell 106 are also activated, and in conjunction with assertion of the word line WL(n−1) fully selects the full-selected cell 106 for a memory operation. The bit lines for the half-selected cells 108 are not activated, hence the cells are "half-selected".

The half-selected cells 108 are susceptible to being disturbed (their stored value flipped) during both READ and WRITE operations on the full-selected cell 106. The full-selected cell 106 can also be disturbed by the process of reading the value stored in it.

Figure 2:
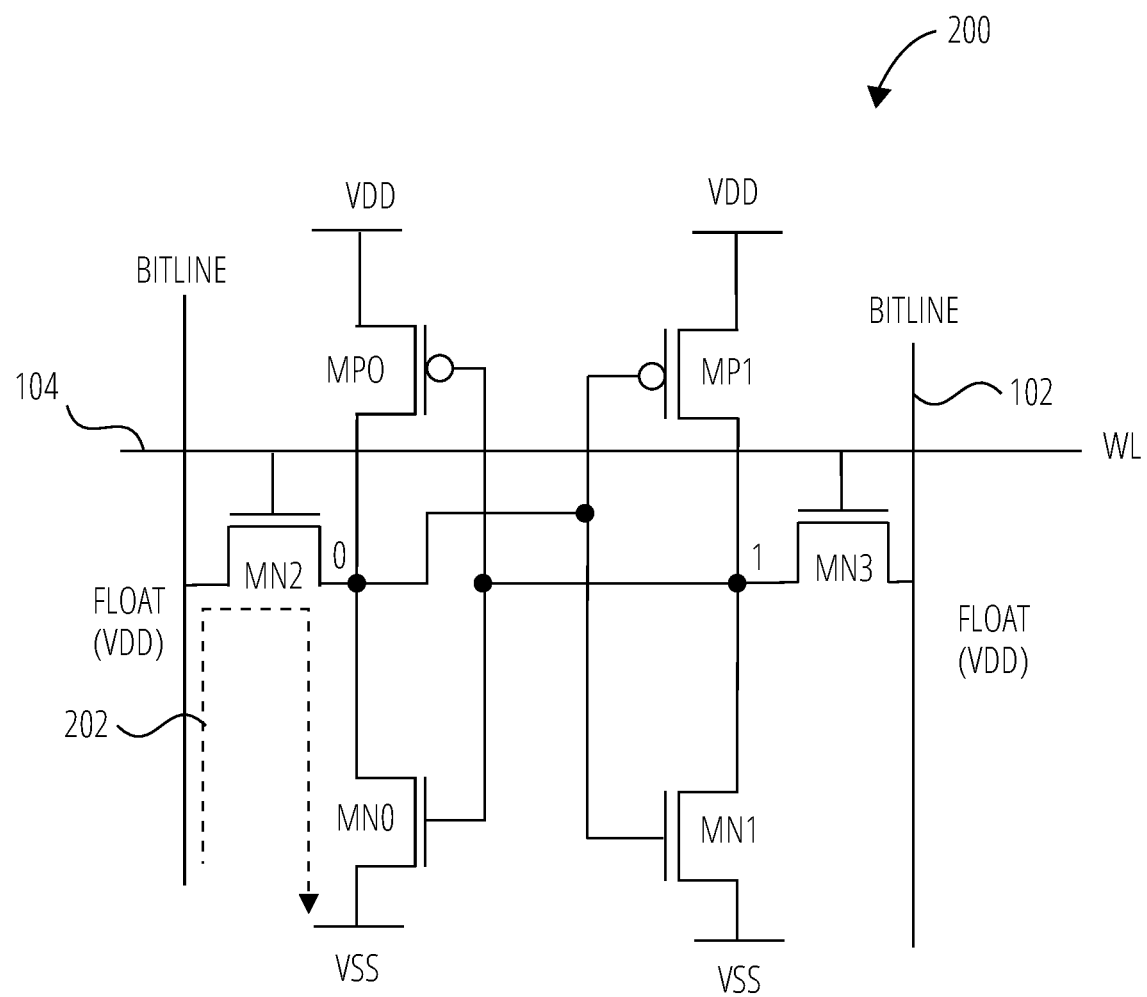
FIG. 2 depicts a six-transistor volatile memory cell 200 in accordance with one embodiment.

FIG. 2 depicts a six-transistor volatile memory cell 200 in one embodiment. Transistors MP0, MP1, MN0 and MN1 form a pair of cross-coupled inverters that store both a value ("0" in the example of FIG. 2) and a complement of the value ("1" in FIG. 2) on its internal nodes (nodes isolated from the bit lines by an access transistor). The transistors MN2 and MN3 are access transistors that enable a circuit (e.g., a sense amplifier) coupled to the six-transistor volatile memory cell 200 to assert the word line 104 to output the stored values onto the bit lines 102.

To READ a value from the six-transistor volatile memory cell 200, the bit lines 102 are first "pre-charged", meaning they are floated to the supply voltage VDD. The word line 104 is then asserted. The bit line connected to MN3 will remain at voltage VDD, e.g., "1", and the bit line connected to MN2 will be pulled to a value of approximately VSS, e.g. "0", which may be 'ground'.

The techniques and circuit embodiments disclosed herein are not limited to six-transistor volatile memory cells and may be utilized in other memory cell implementations such as eight-transistor (or more) cells.

Read disturb can occur when the discharge of the bit line connected to the stored "0" internal node generates a transient charge flow 202 and increase in voltage at the internal node storing the "0". If this voltage exceeds the tipping point of the inverter (MP0, MN0), the inverter will "flip" such that the values stored in the internal nodes swap (the "0" becomes a "1" and vice-versa). This can be a problem in both full-selected cells and half-selected cells.

Figure 3:
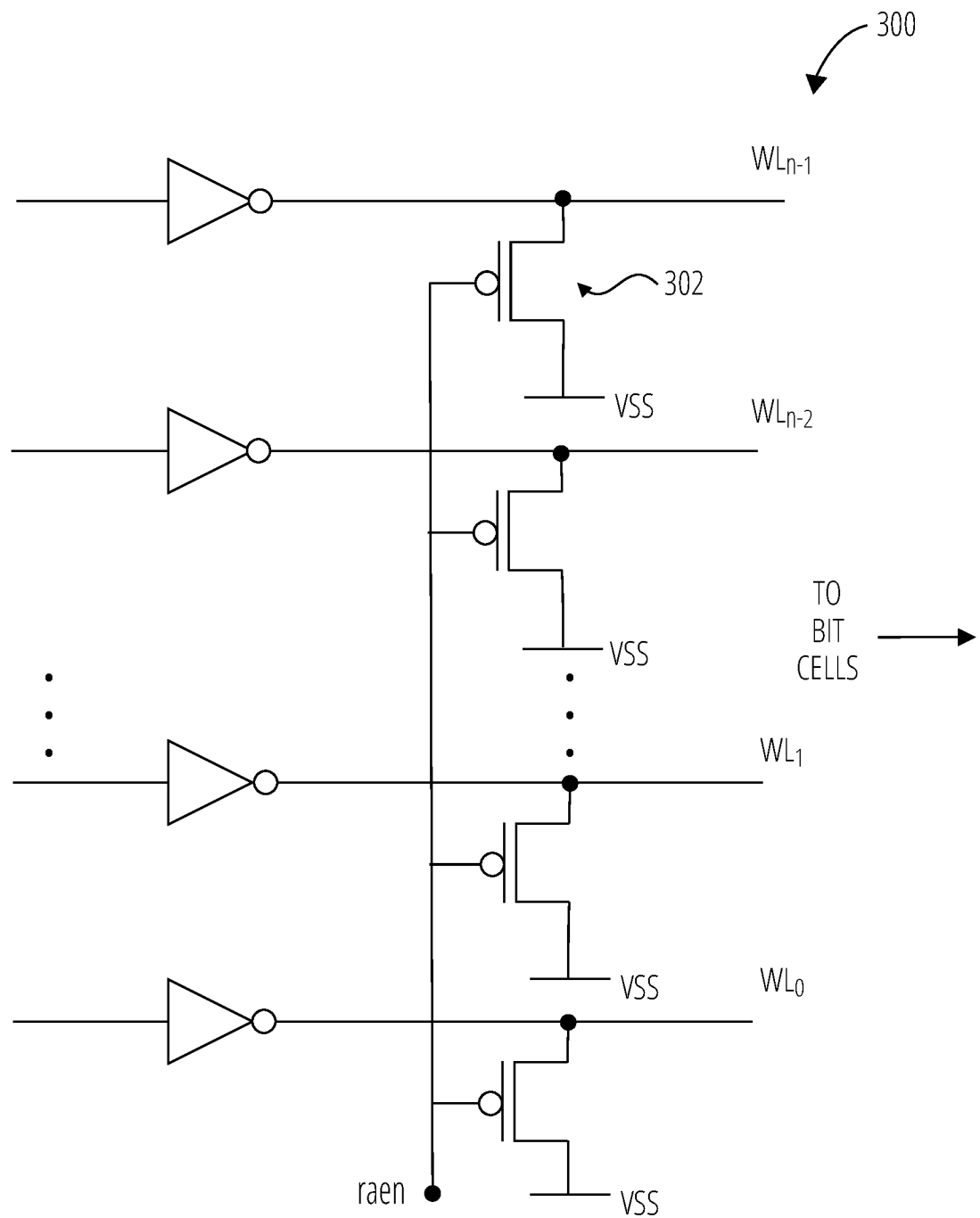
FIG. 3 depicts a conventional word lines 300 lowering implementation.

FIG. 3 depicts word lines 300 to memory cells in one embodiment. There would typically be many more such word lines than are depicted, for example anywhere from 15 to 512 word lines, or even more. The word line $WL_{n-1}$ is the "top" word line and the word line $WL_0$ is the bottom word line. The top and bottom word lines may be referred to as "boundary word lines" herein.

During a READ operation the signal RAEN (Read Assist ENable) is applied during an interval of time to mitigate read disturb effects. The pull-down transistors 302 are "ON" (conducting) when RAEN is "0". Activating (turning on) the pull-down transistors 302 during an overlapping time interval with assertion of the word line to the memory cells creates a suppressed region in the voltage on an asserted word line which lessens the charge flow and transient voltage at the internal nodes of the memory cells on the word line that store a "0" value. Reducing the transient voltage lessens the likelihood of a read disturb occurring in these memory cells.

Figure 4:
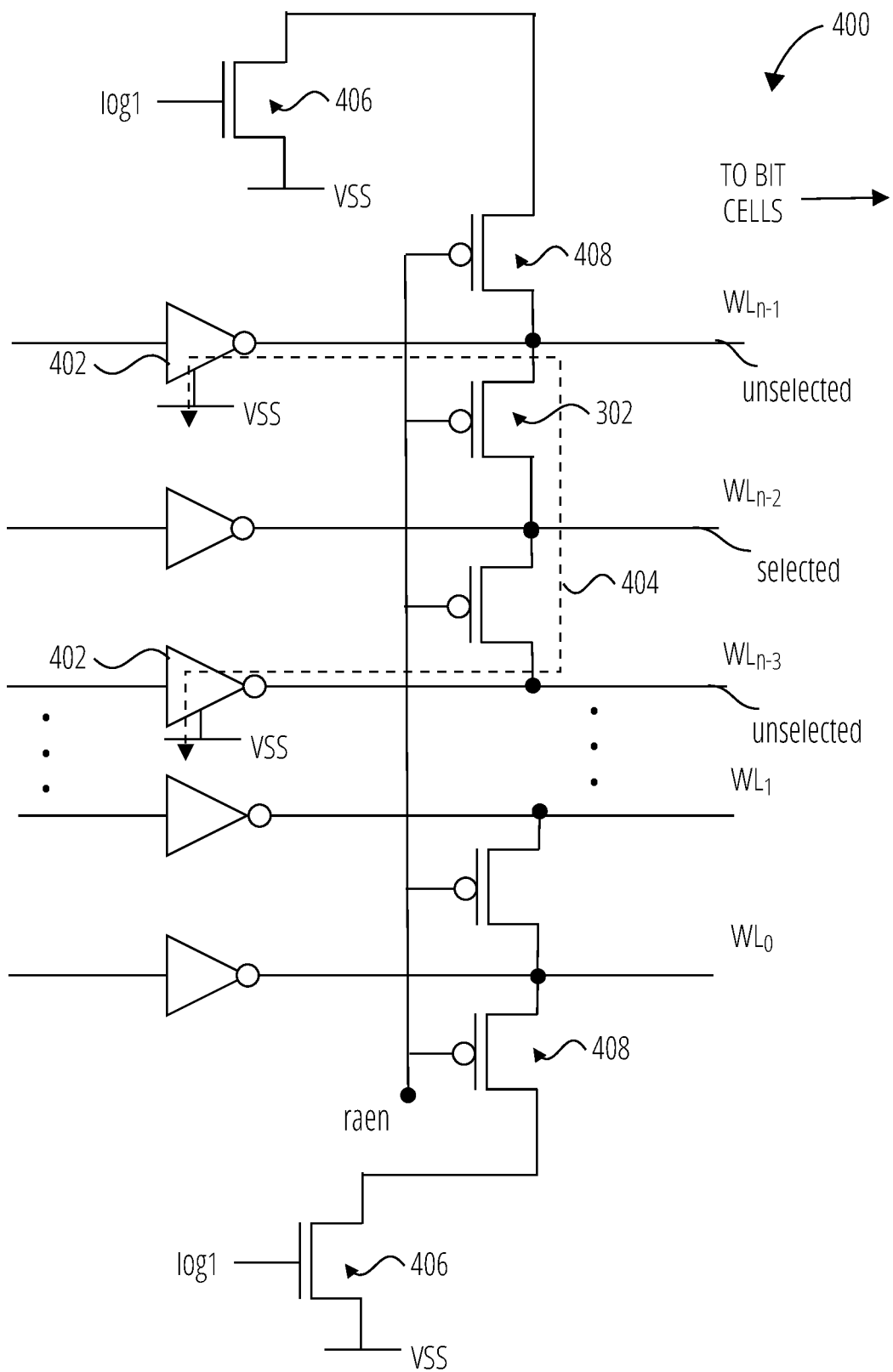
FIG. 4 depicts a word lines 400 lowering implementation in accordance with one embodiment.

FIG. 4 depicts word lines 400 in one embodiment. While RAEN is maintained low ("0") during an overlapping time interval of an activated word line, the inverters 402 on the unselected word lines provide a charge flow 404 path to ground for the selected word line. The charge flow 404 is depicted to the two unselected word lines adjacent to the selected word line, but actually extends to some extent through all the inverters (word line drivers) on the unselected word lines. The depicted inverters 402 are a type referred to herein as PN inverters, meaning they comprise a PMOS transistor and an NMOS transistor in series between VDD and ground, and the output of the inverter is taken from the junction node of the transistors. RAEN is then asserted for a part of the time the WL is asserted, allowing the WL to charge to VDD.

Figure 5:
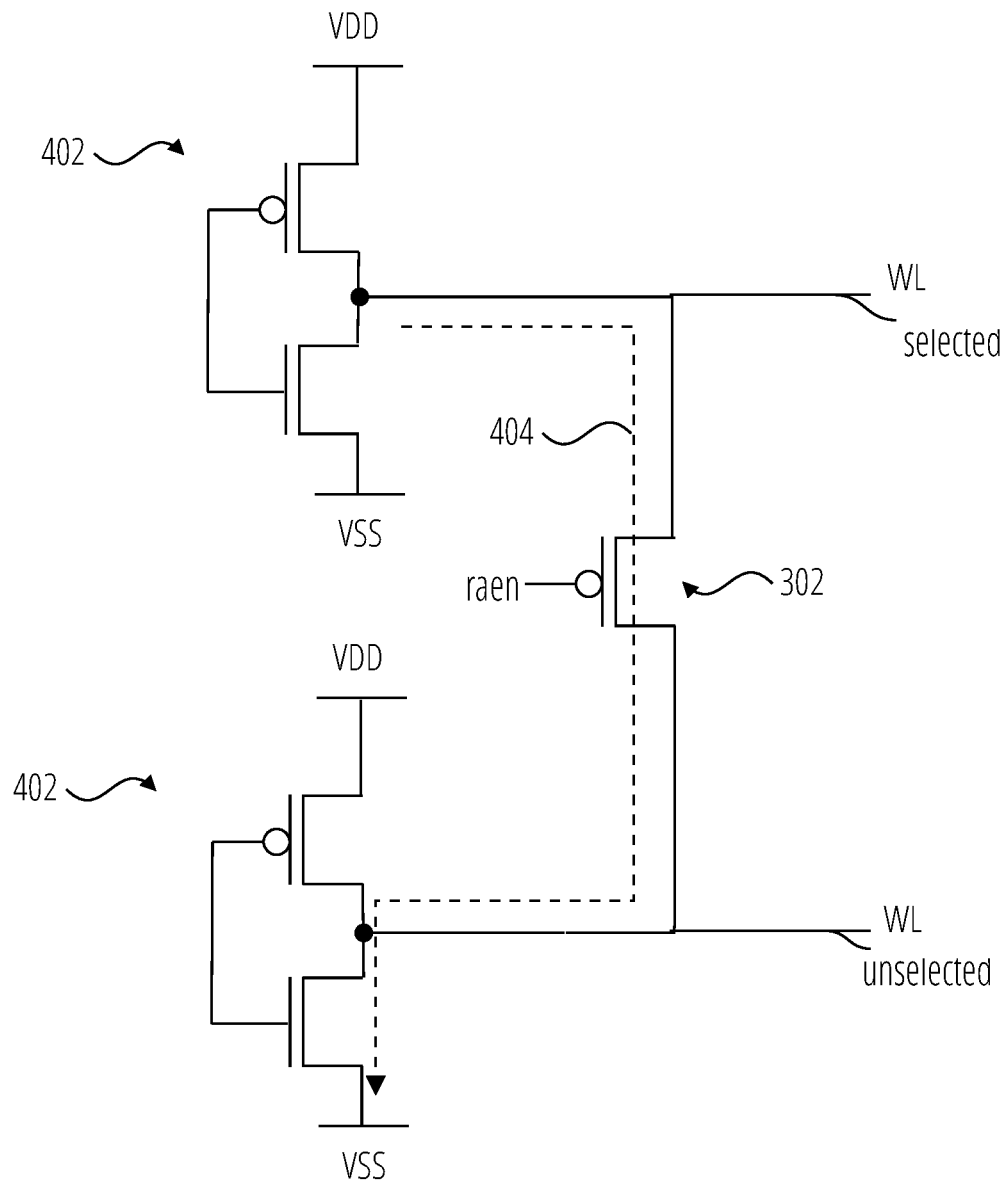
FIG. 5 depicts in more detail an example discharge of a selected word line through the inverter of an adjacent word line.
Figure 6:
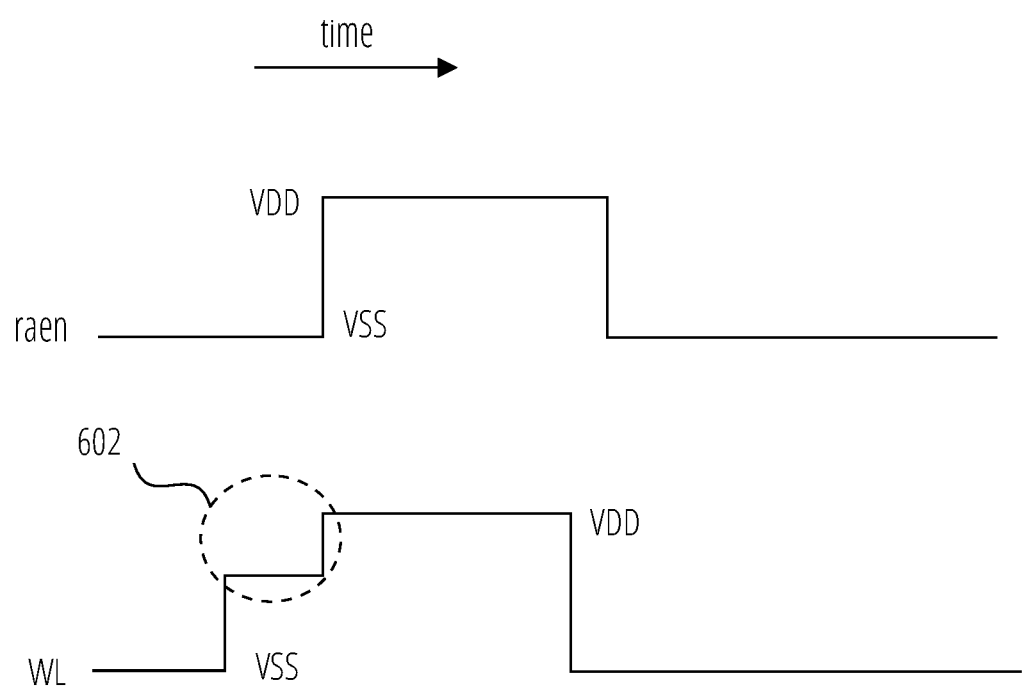
FIG. 6 depicts a word line signal and a read assist enable signal in accordance with one embodiment.

FIG. 5 depicts in more detail an example discharge of a selected word line through the inverter driving an adjacent word line. FIG. 6 depicts an example timing and level of the RAEN and selected word line voltages.

RAEN is maintained low for an overlapping time interval during which WL is also asserted. The WL voltage experiences a suppressed region 602 that mitigates read disturb in both the full-selected cell and half-selected cells. By way of example, the suppressed region 602 may comprise a voltage level of ½ to ¾ of VDD, the fully-asserted word line voltage level. The suppressed region reduces the conductivity of the access transistor (e.g., MN2) in the memory cells on the selected word line and thus reduces the charge flow to the internal node of the memory cells along the selected word line that store a "0" value. Read disturb is thereby mitigated in these memory cells.

Although depicted as PMOS transistors, the pull-down transistors 302 may in other embodiments be implemented as NMOS transistors, with RAEN turned on ("1") during the overlapping time interval. Likewise, the boundary discharge transistors 406 may be PMOS and the dummy transistors 408 may be NMOS. More generally, any voltage divider circuit arrangement that can be dynamically switched or controlled may be utilized between the word lines, and between the word lines and VSS on the boundaries.

For the word lines at the boundaries ($WL_{n-1}$, $WL_0$), additional boundary discharge transistors 406 (e.g., NMOS) and dummy transistors 408 (e.g., PMOS) balance the discharge path when those word lines are selected. These transistor pairs provides an impedance that is similar to the impedance (between a word line and VSS) of the inverters 402. The signal "log1" (meaning logical "1") is used to drive the boundary discharge transistor 406 and may be active while RAEN is active. This helps equalize discharge between the adjacent word line and the corresponding boundary discharge transistor 406 and also enables PVT tracking with the word line drivers for these word lines.

In the word lines 400 implementation the pull-down transistors 302 may be smaller (take less area on a circuit die) than those utilized in the conventional word lines 300 lowering implementation, due to the discharge current being spread across multiple paths.

Figure 7:
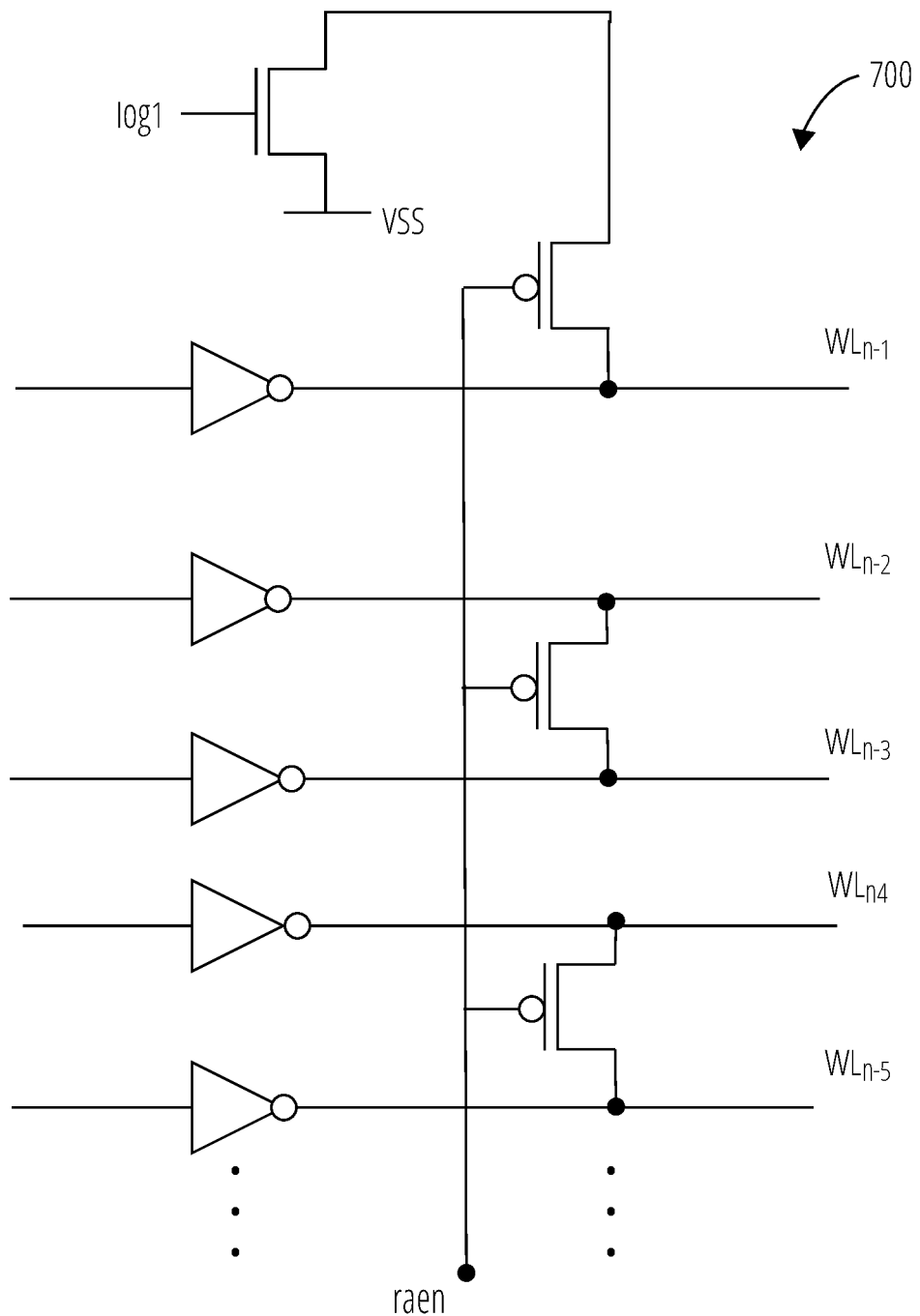
FIG. 7 depicts a word lines 700 lowering implementation in accordance with another embodiment.

FIG. 7 depicts an alternate embodiment of word lines 700 in which the pull-down transistors 302 are not connected in a stack but rather a pull-down transistor 302 is deployed between adjacent pairs of word lines. The tradeoffs are fewer paths for discharge for each word line, at the benefit of using only half of the number of pull-down transistors 302. Generally any grouping of word lines may be coupled via a series of pull-down transistors 302, e.g., groups of two as depicted, or groups of three, or four, etc.

Figure 8:
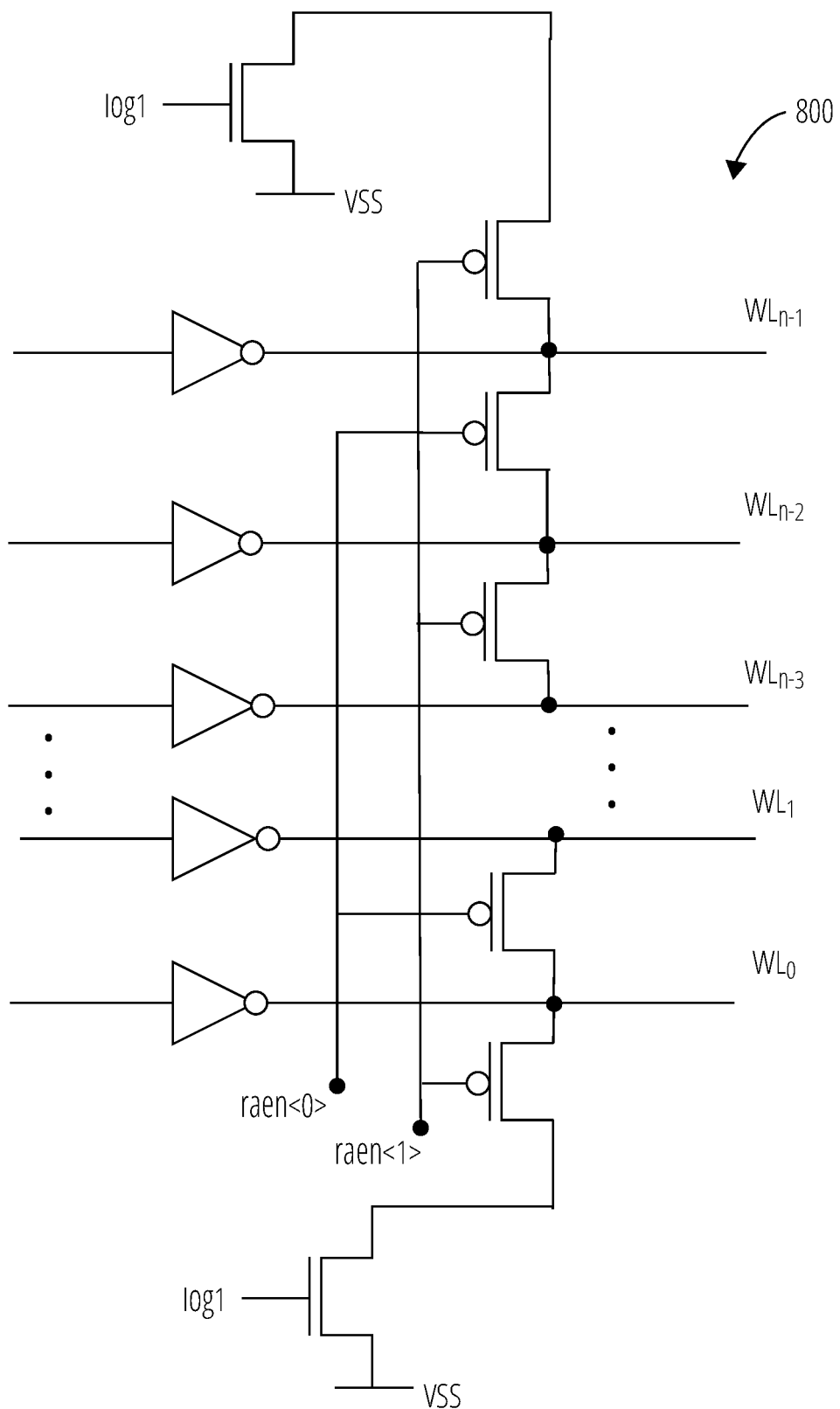
FIG. 8 depicts a word lines 800 lowering implementation in accordance with yet another embodiment.

FIG. 8 depicts word lines 800 in another embodiment. As with the word lines 400 embodiment, there is a full stack of pull-down transistors 302 connected between the word lines. Utilizing independent control signals, RAEN<1> and RAEN<0>, independent activation of different groups of the pull-down transistors 302 is enabled. This may be beneficial to more precisely control power consumption or to tuning the applied level of read disturb mitigation (via controlling the number of discharge paths from any particular word line). Generally, any number of independent control signals RAEN<0> . . . RAEN<n-1> may be utilized depending on the precision of control over power consumption and word lines desired.

The circuits and techniques disclosed herein may be utilized in computing devices utilizing one or more graphic processing unit (GPU) and/or general purpose data processor (e.g., a 'central processing unit or CPU). Exemplary architectures will now be described that may be thus configured.

The following description may use certain acronyms and abbreviations as follows:
  "DPC" refers to a "data processing cluster";
  "GPC" refers to a "general processing cluster";
  "I/O" refers to a "input/output";
  "L1 cache" refers to "level one cache", one type of memory that may utilized the disclosed embodiments;
  "L2 cache" refers to "level two cache", another type of memory that may utilized the disclosed embodiments;
  "LSU" refers to a "load/store unit";
  "MMU" refers to a "memory management unit", an integrated circuit that may comprise operational logic (e.g., signals and timing) to carry out the embodiments disclosed herein;
  "MPC" refers to an "M-pipe controller";
  "PPU" refers to a "parallel processing unit";
  "PROP" refers to a "pre-raster operations unit";
  "ROP" refers to a "raster operations";
  "SFU" refers to a "special function unit";
  "SM" refers to a "streaming multiprocessor";
  "Viewport SCC" refers to "viewport scale, cull, and clip";
  "WDX" refers to a "work distribution crossbar"; and
  "XBar" refers to a "crossbar".

Parallel Processing Unit

Figure 9:
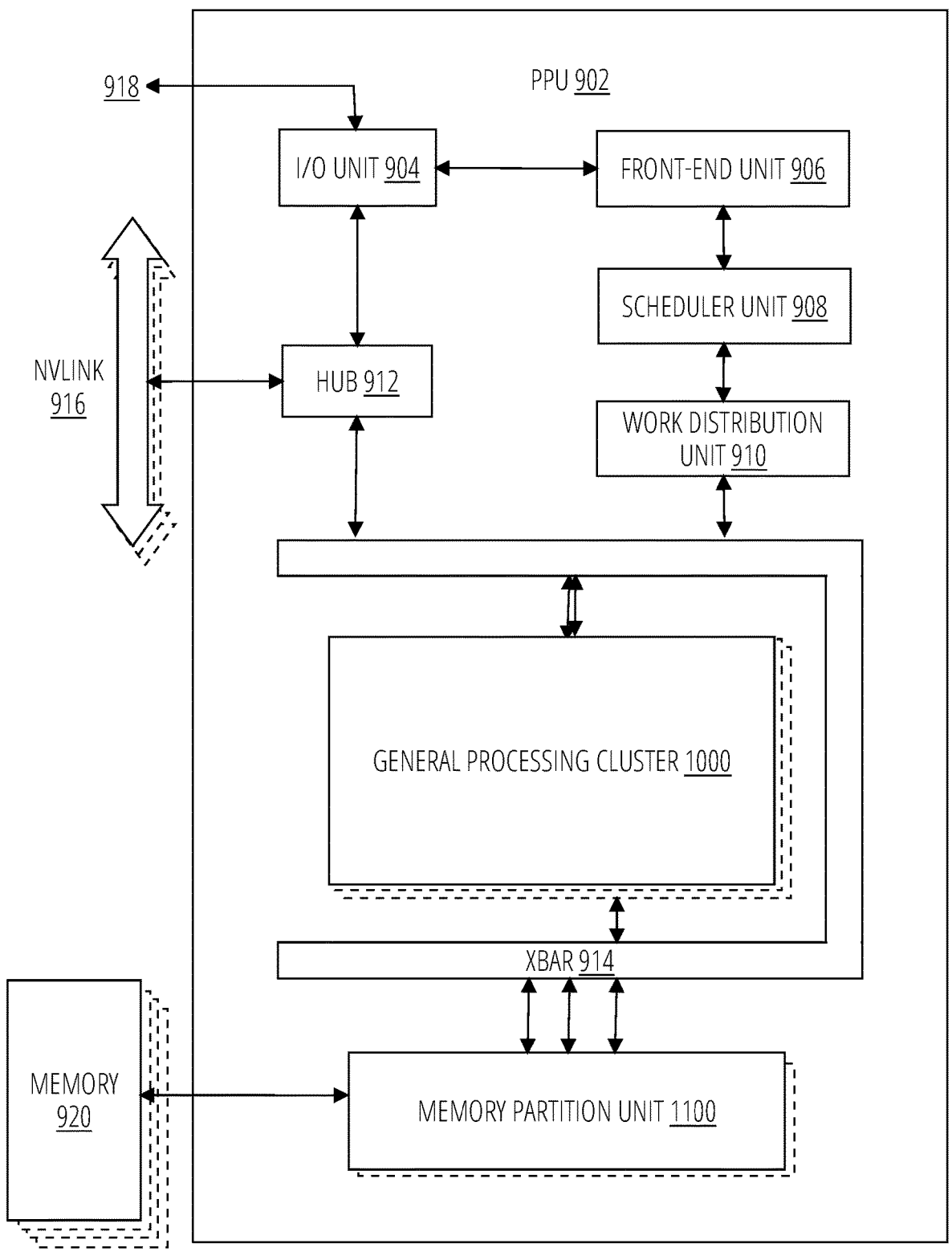
FIG. 9 depicts a parallel processing unit 902 in accordance with one embodiment.

FIG. 9 depicts a parallel processing unit 902, in accordance with an embodiment. In an embodiment, the parallel processing unit 902 is a multi-threaded processor that is implemented on one or more integrated circuit devices. The parallel processing unit 902 is a latency hiding architecture designed to process many threads in parallel. A thread (e.g., a thread of execution) is an instantiation of a set of instructions configured to be executed by the parallel processing unit 902. In an embodiment, the parallel processing unit 902 is a graphics processing unit (GPU) configured to implement a graphics rendering pipeline for processing three-dimensional (3D) graphics data in order to generate two-dimensional (2D) image data for display on a display device such as a liquid crystal display (LCD) device. In other embodiments, the parallel processing unit 902 may be utilized for performing general-purpose computations. While one exemplary parallel processor is provided herein for illustrative purposes, it should be strongly noted that such processor is set forth for illustrative purposes only, and that any processor may be employed to supplement and/or substitute for the same.

One or more parallel processing unit 902 modules may be configured to accelerate thousands of High Performance Computing (HPC), data center, and machine learning applications. The parallel processing unit 902 may be configured to accelerate numerous deep learning systems and applications including autonomous vehicle platforms, deep learning, high-accuracy speech, image, and text recognition systems, intelligent video analytics, molecular simulations, drug discovery, disease diagnosis, weather forecasting, big data analytics, astronomy, molecular dynamics simulation, financial modeling, robotics, factory automation, real-time language translation, online search optimizations, and personalized user recommendations, and the like.

As shown in FIG. 9, the parallel processing unit 902 includes an I/O unit 904, a front-end unit 906, a scheduler unit 908, a work distribution unit 910, a hub 912, a crossbar 914, one or more general processing cluster 1000 modules, and one or more memory partition unit 1100 modules. The parallel processing unit 902 may be connected to a host processor or other parallel processing unit 902 modules via one or more high-speed NVLink 916 interconnects. The parallel processing unit 902 may be connected to a host processor or other peripheral devices via an interconnect 918. The parallel processing unit 902 may also be connected to a local memory comprising a number of memory 920 devices. In an embodiment, the local memory may comprise a number of dynamic random access memory (DRAM) devices or SRAM devices, and may utilize the embodiments disclosed herein. The DRAM or SRAM devices may be configured as a high-bandwidth memory (HBM) subsystem, with multiple dies stacked within each device. The memory 920 may comprise logic to configure the parallel processing unit 902 to carry out aspects of the techniques disclosed herein.

The NVLink 916 interconnect enables systems to scale and include one or more parallel processing unit 902 modules combined with one or more CPUs, supports cache coherence between the parallel processing unit 902 modules and CPUs, and CPU mastering. Data and/or commands may be transmitted by the NVLink 916 through the hub 912 to/from other units of the parallel processing unit 902 such as one or more copy engines, a video encoder, a video decoder, a power management unit, etc. (not explicitly shown). The NVLink 916 is described in more detail in conjunction with FIG. 13.

The I/O unit 904 is configured to transmit and receive communications (e.g., commands, data, etc.) from a host processor (not shown) over the interconnect 918. The I/O unit 904 may communicate with the host processor directly via the interconnect 918 or through one or more intermediate devices such as a memory bridge. In an embodiment, the I/O unit 904 may communicate with one or more other processors, such as one or more parallel processing unit 902 modules via the interconnect 918. In an embodiment, the I/O unit 904 implements a Peripheral Component Interconnect Express (PCIe) interface for communications over a PCIe bus and the interconnect 918 is a PCIe bus. In alternative embodiments, the I/O unit 904 may implement other types of well-known interfaces for communicating with external devices.

The I/O unit 904 decodes packets received via the interconnect 918. In an embodiment, the packets represent commands configured to cause the parallel processing unit 902 to perform various operations. The I/O unit 904 transmits the decoded commands to various other units of the parallel processing unit 902 as the commands may specify. For example, some commands may be transmitted to the front-end unit 906. Other commands may be transmitted to the hub 912 or other units of the parallel processing unit 902 such as one or more copy engines, a video encoder, a video decoder, a power management unit, etc. (not explicitly shown). In other words, the I/O unit 904 is configured to route communications between and among the various logical units of the parallel processing unit 902.

In an embodiment, a program executed by the host processor encodes a command stream in a buffer that provides workloads to the parallel processing unit 902 for processing. A workload may comprise several instructions and data to be processed by those instructions. The buffer is a region in a memory that is accessible (e.g., read/write) by both the host processor and the parallel processing unit 902. For example, the I/O unit 904 may be configured to access the buffer in a system memory connected to the interconnect 918 via memory requests transmitted over the interconnect 918. In an embodiment, the host processor writes the command stream to the buffer and then transmits a pointer to the start of the command stream to the parallel processing unit

902. The front-end unit 906 receives pointers to one or more command streams. The front-end unit 906 manages the one or more streams, reading commands from the streams and forwarding commands to the various units of the parallel processing unit 902.

The front-end unit 906 is coupled to a scheduler unit 908 that configures the various general processing cluster 1000 modules to process tasks defined by the one or more streams. The scheduler unit 908 is configured to track state information related to the various tasks managed by the scheduler unit 908. The state may indicate which general processing cluster 1000 a task is assigned to, whether the task is active or inactive, a priority level associated with the task, and so forth. The scheduler unit 908 manages the execution of a plurality of tasks on the one or more general processing cluster 1000 modules.

The scheduler unit 908 is coupled to a work distribution unit 910 that is configured to dispatch tasks for execution on the general processing cluster 1000 modules. The work distribution unit 910 may track a number of scheduled tasks received from the scheduler unit 908. In an embodiment, the work distribution unit 910 manages a pending task pool and an active task pool for each of the general processing cluster 1000 modules. The pending task pool may comprise a number of slots (e.g., 32 slots) that contain tasks assigned to be processed by a particular general processing cluster 1000. The active task pool may comprise a number of slots (e.g., 4 slots) for tasks that are actively being processed by the general processing cluster 1000 modules. As a general processing cluster 1000 finishes the execution of a task, that task is evicted from the active task pool for the general processing cluster 1000 and one of the other tasks from the pending task pool is selected and scheduled for execution on the general processing cluster 1000. If an active task has been idle on the general processing cluster 1000, such as while waiting for a data dependency to be resolved, then the active task may be evicted from the general processing cluster 1000 and returned to the pending task pool while another task in the pending task pool is selected and scheduled for execution on the general processing cluster 1000.

The work distribution unit 910 communicates with the one or more general processing cluster 1000 modules via crossbar 914. The crossbar 914 is an interconnect network that couples many of the units of the parallel processing unit 902 to other units of the parallel processing unit 902. For example, the crossbar 914 may be configured to couple the work distribution unit 910 to a particular general processing cluster 1000. Although not shown explicitly, one or more other units of the parallel processing unit 902 may also be connected to the crossbar 914 via the hub 912.

The tasks are managed by the scheduler unit 908 and dispatched to a general processing cluster 1000 by the work distribution unit 910. The general processing cluster 1000 is configured to process the task and generate results. The results may be consumed by other tasks within the general processing cluster 1000, routed to a different general processing cluster 1000 via the crossbar 914, or stored in the memory 920. The results can be written to the memory 920 via the memory partition unit 1100 modules, which implement a memory interface for reading and writing data to/from the memory 920. The results can be transmitted to another parallel processing unit 902 or CPU via the NVLink 916. In an embodiment, the parallel processing unit 902 includes a number U of memory partition unit 1100 modules that is equal to the number of separate and distinct memory 920 devices coupled to the parallel processing unit 902. A memory partition unit 1100 will be described in more detail below in conjunction with FIG. 11.

In an embodiment, a host processor executes a driver kernel that implements an application programming interface (API) that enables one or more applications executing on the host processor to schedule operations for execution on the parallel processing unit 902. In an embodiment, multiple compute applications are simultaneously executed by the parallel processing unit 902 and the parallel processing unit 902 provides isolation, quality of service (QoS), and independent address spaces for the multiple compute applications. An application may generate instructions (e.g., API calls) that cause the driver kernel to generate one or more tasks for execution by the parallel processing unit 902. The driver kernel outputs tasks to one or more streams being processed by the parallel processing unit 902. Each task may comprise one or more groups of related threads, referred to herein as a warp. In an embodiment, a warp comprises 32 related threads that may be executed in parallel. Cooperating threads may refer to a plurality of threads including instructions to perform the task and that may exchange data through shared memory. Threads and cooperating threads are described in more detail in conjunction with FIG. 12.

Figure 10:
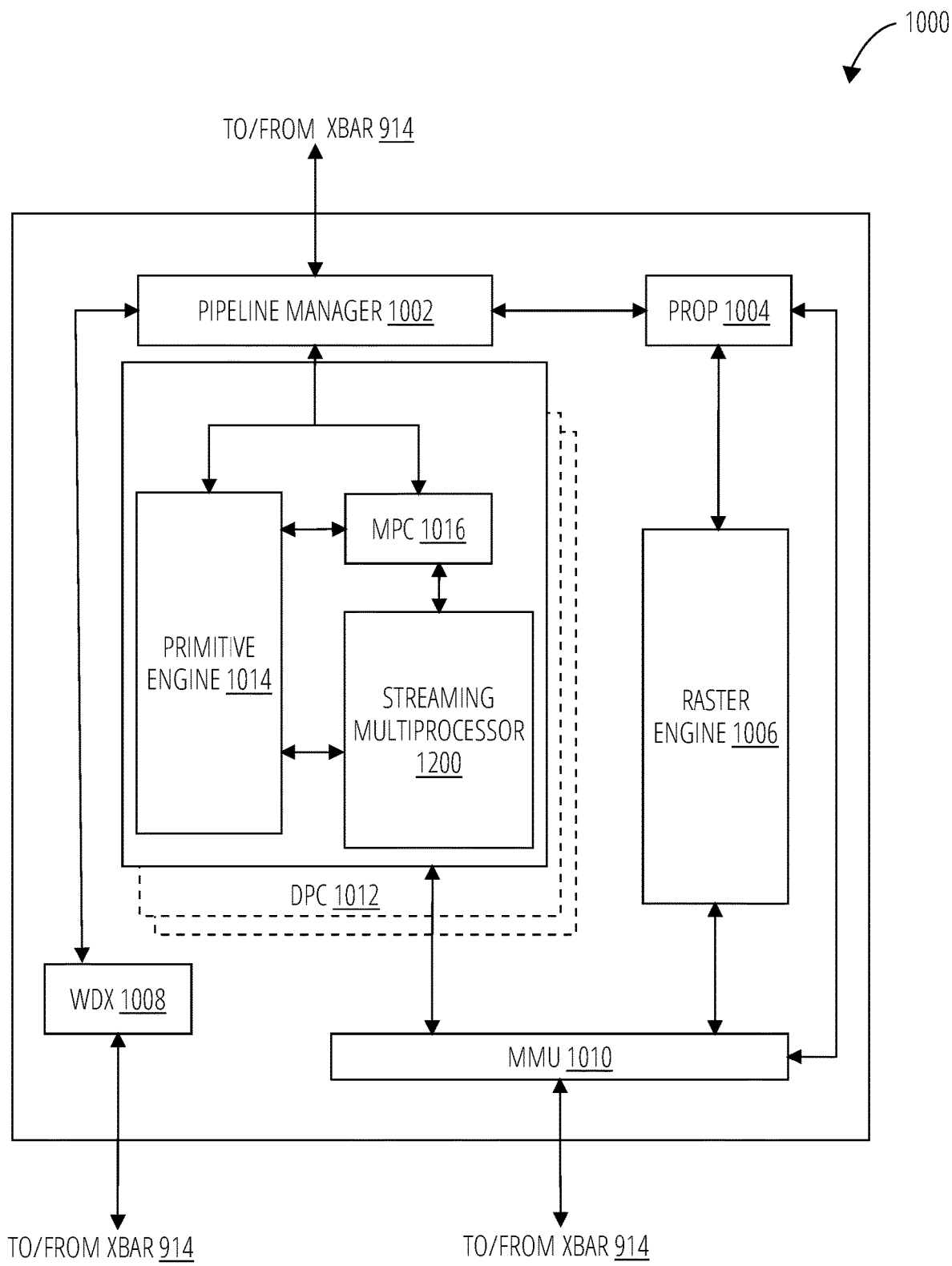
FIG. 10 depicts a general processing cluster 1000 in accordance with one embodiment.

FIG. 10 depicts a general processing cluster 1000 of the parallel processing unit 902 of FIG. 9, in accordance with an embodiment. As shown in FIG. 10, each general processing cluster 1000 includes a number of hardware units for processing tasks. In an embodiment, each general processing cluster 1000 includes a pipeline manager 1002, a pre-raster operations unit 1004, a raster engine 1006, a work distribution crossbar 1008, a memory management unit 1010, and one or more data processing cluster 1012. It will be appreciated that the general processing cluster 1000 of FIG. 10 may include other hardware units in lieu of or in addition to the units shown in FIG. 10.

In an embodiment, the operation of the general processing cluster 1000 is controlled by the pipeline manager 1002. The pipeline manager 1002 manages the configuration of the one or more data processing cluster 1012 modules for processing tasks allocated to the general processing cluster 1000. In an embodiment, the pipeline manager 1002 may configure at least one of the one or more data processing cluster 1012 modules to implement at least a portion of a graphics rendering pipeline. For example, a data processing cluster 1012 may be configured to execute a vertex shader program on the programmable streaming multiprocessor 1200. The pipeline manager 1002 may also be configured to route packets received from the work distribution unit 910 to the appropriate logical units within the general processing cluster 1000. For example, some packets may be routed to fixed function hardware units in the pre-raster operations unit 1004 and/or raster engine 1006 while other packets may be routed to the data processing cluster 1012 modules for processing by the primitive engine 1014 or the streaming multiprocessor 1200. In an embodiment, the pipeline manager 1002 may configure at least one of the one or more data processing cluster 1012 modules to implement a neural network model and/or a computing pipeline.

Figure 11:
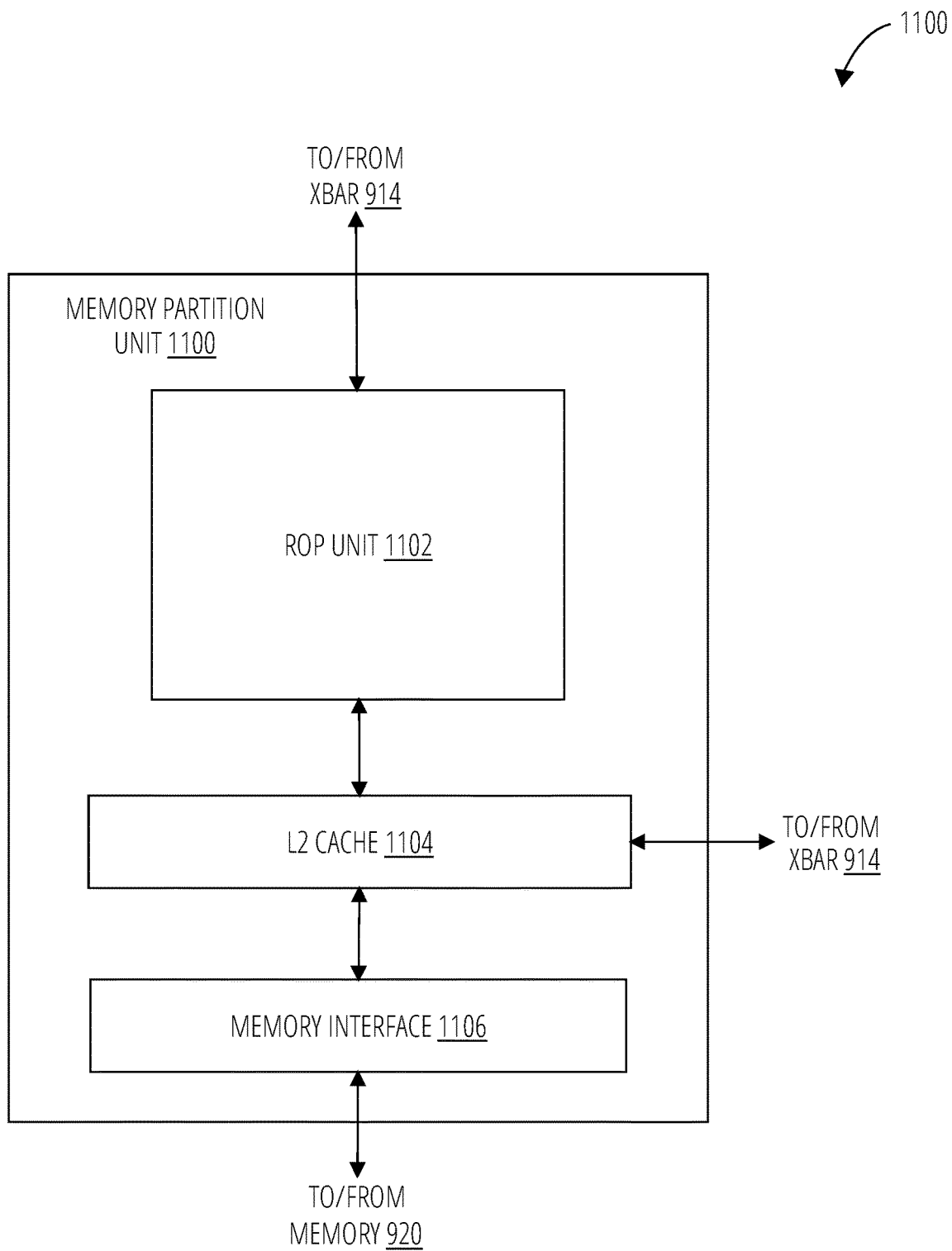
FIG. 11 depicts a memory partition unit 1100 in accordance with one embodiment.

The pre-raster operations unit 1004 is configured to route data generated by the raster engine 1006 and the data processing cluster 1012 modules to a Raster Operations (ROP) unit, described in more detail in conjunction with FIG. 11. The pre-raster operations unit 1004 may also be configured to perform optimizations for color blending, organize pixel data, perform address translations, and the like.

The raster engine 1006 includes a number of fixed function hardware units configured to perform various raster operations. In an embodiment, the raster engine 1006 includes a setup engine, a coarse raster engine, a culling engine, a clipping engine, a fine raster engine, and a tile coalescing engine. The setup engine receives transformed vertices and generates plane equations associated with the geometric primitive defined by the vertices. The plane equations are transmitted to the coarse raster engine to generate coverage information (e.g., an x, y coverage mask for a tile) for the primitive. The output of the coarse raster engine is transmitted to the culling engine where fragments associated with the primitive that fail a z-test are culled, and transmitted to a clipping engine where fragments lying outside a viewing frustum are clipped. Those fragments that survive clipping and culling may be passed to the fine raster engine to generate attributes for the pixel fragments based on the plane equations generated by the setup engine. The output of the raster engine 1006 comprises fragments to be processed, for example, by a fragment shader implemented within a data processing cluster 1012.

Each data processing cluster 1012 included in the general processing cluster 1000 includes an M-pipe controller 1016, a primitive engine 1014, and one or more streaming multiprocessor 1200 modules. The M-pipe controller 1016 controls the operation of the data processing cluster 1012, routing packets received from the pipeline manager 1002 to the appropriate units in the data processing cluster 1012. For example, packets associated with a vertex may be routed to the primitive engine 1014, which is configured to fetch vertex attributes associated with the vertex from the memory 920. In contrast, packets associated with a shader program may be transmitted to the streaming multiprocessor 1200.

The streaming multiprocessor 1200 comprises a programmable streaming processor that is configured to process tasks represented by a number of threads. Each streaming multiprocessor 1200 is multi-threaded and configured to execute a plurality of threads (e.g., 32 threads) from a particular group of threads concurrently. In an embodiment, the streaming multiprocessor 1200 implements a Single-Instruction, Multiple-Data (SIMD) architecture where each thread in a group of threads (e.g., a warp) is configured to process a different set of data based on the same set of instructions. All threads in the group of threads execute the same instructions. In another embodiment, the streaming multiprocessor 1200 implements a Single-Instruction, Multiple Thread (SIMT) architecture where each thread in a group of threads is configured to process a different set of data based on the same set of instructions, but where individual threads in the group of threads are allowed to diverge during execution. In an embodiment, a program counter, call stack, and execution state is maintained for each warp, enabling concurrency between warps and serial execution within warps when threads within the warp diverge. In another embodiment, a program counter, call stack, and execution state is maintained for each individual thread, enabling equal concurrency between all threads, within and between warps. When execution state is maintained for each individual thread, threads executing the same instructions may be converged and executed in parallel for maximum efficiency. The streaming multiprocessor 1200 will be described in more detail below in conjunction with FIG. 12.

The memory management unit 1010 provides an interface between the general processing cluster 1000 and the memory partition unit 1100. The memory management unit 1010 may provide translation of virtual addresses into physical addresses, memory protection, and arbitration of memory requests. In an embodiment, the memory management unit 1010 provides one or more translation lookaside buffers (TLBs) for performing translation of virtual addresses into physical addresses in the memory 920.

FIG. 11 depicts a memory partition unit 1100 of the parallel processing unit 902 of FIG. 9, in accordance with an embodiment. As shown in FIG. 11, the memory partition unit 1100 includes a raster operations unit 1102, a level two cache 1104, and a memory interface 1106. The memory interface 1106 is coupled to the memory 920. Memory interface 1106 may implement 32, 64, 128, 1024-bit data buses, or the like, for high-speed data transfer. In an embodiment, the parallel processing unit 902 incorporates U memory interface 1106 modules, one memory interface 1106 per pair of memory partition unit 1100 modules, where each pair of memory partition unit 1100 modules is connected to a corresponding memory 920 device. For example, parallel processing unit 902 may be connected to up to Y memory 920 devices, such as high bandwidth memory stacks or graphics double-data-rate, version 5, synchronous dynamic random access memory, or other types of persistent storage.

In an embodiment, the memory interface 1106 implements an HBM2 memory interface and Y equals half U. In an embodiment, the HBM2 memory stacks are located on the same physical package as the parallel processing unit 902, providing substantial power and area savings compared with conventional GDDR5 SDRAM systems. In an embodiment, each HBM2 stack includes four memory dies and Y equals 4, with HBM2 stack including two 128-bit channels per die for a total of 8 channels and a data bus width of 1024 bits.

In an embodiment, the memory 920 supports Single-Error Correcting Double-Error Detecting (SECDED) Error Correction Code (ECC) to protect data. ECC provides higher reliability for compute applications that are sensitive to data corruption. Reliability is especially important in large-scale cluster computing environments where parallel processing unit 902 modules process very large datasets and/or run applications for extended periods.

In an embodiment, the parallel processing unit 902 implements a multi-level memory hierarchy. In an embodiment, the memory partition unit 1100 supports a unified memory to provide a single unified virtual address space for CPU and parallel processing unit 902 memory, enabling data sharing between virtual memory systems. In an embodiment the frequency of accesses by a parallel processing unit 902 to memory located on other processors is traced to ensure that memory pages are moved to the physical memory of the parallel processing unit 902 that is accessing the pages more frequently. In an embodiment, the NVLink 916 supports address translation services allowing the parallel processing unit 902 to directly access a CPU's page tables and providing full access to CPU memory by the parallel processing unit 902.

In an embodiment, copy engines transfer data between multiple parallel processing unit 902 modules or between parallel processing unit 902 modules and CPUs. The copy engines can generate page faults for addresses that are not mapped into the page tables. The memory partition unit 1100 can then service the page faults, mapping the addresses into the page table, after which the copy engine can perform the transfer. In a conventional system, memory is pinned (e.g., non-pageable) for multiple copy engine operations between multiple processors, substantially reducing the available memory. With hardware page faulting, addresses can be passed to the copy engines without worrying if the memory pages are resident, and the copy process is transparent.

Data from the memory 920 or other system memory may be fetched by the memory partition unit 1100 and stored in the level two cache 1104, which is located on-chip and is shared between the various general processing cluster 1000 modules. As shown, each memory partition unit 1100 includes a portion of the level two cache 1104 associated with a corresponding memory 920 device. Lower level caches may then be implemented in various units within the general processing cluster 1000 modules. For example, each of the streaming multiprocessor 1200 modules may implement an L1 cache. The L1 cache is private memory that is dedicated to a particular streaming multiprocessor 1200. Data from the level two cache 1104 may be fetched and stored in each of the L1 caches for processing in the functional units of the streaming multiprocessor 1200 modules. The level two cache 1104 is coupled to the memory interface 1106 and the crossbar 914.

The raster operations unit 1102 performs graphics raster operations related to pixel color, such as color compression, pixel blending, and the like. The raster operations unit 1102 also implements depth testing in conjunction with the raster engine 1006, receiving a depth for a sample location associated with a pixel fragment from the culling engine of the raster engine 1006. The depth is tested against a corresponding depth in a depth buffer for a sample location associated with the fragment. If the fragment passes the depth test for the sample location, then the raster operations unit 1102 updates the depth buffer and transmits a result of the depth test to the raster engine 1006. It will be appreciated that the number of partition memory partition unit 1100 modules may be different than the number of general processing cluster 1000 modules and, therefore, each raster operations unit 1102 may be coupled to each of the general processing cluster 1000 modules. The raster operations unit 1102 tracks packets received from the different general processing cluster 1000 modules and determines which general processing cluster 1000 that a result generated by the raster operations unit 1102 is routed to through the crossbar 914. Although the raster operations unit 1102 is included within the memory partition unit 1100 in FIG. 11, in other embodiment, the raster operations unit 1102 may be outside of the memory partition unit 1100. For example, the raster operations unit 1102 may reside in the general processing cluster 1000 or another unit.

Figure 12:
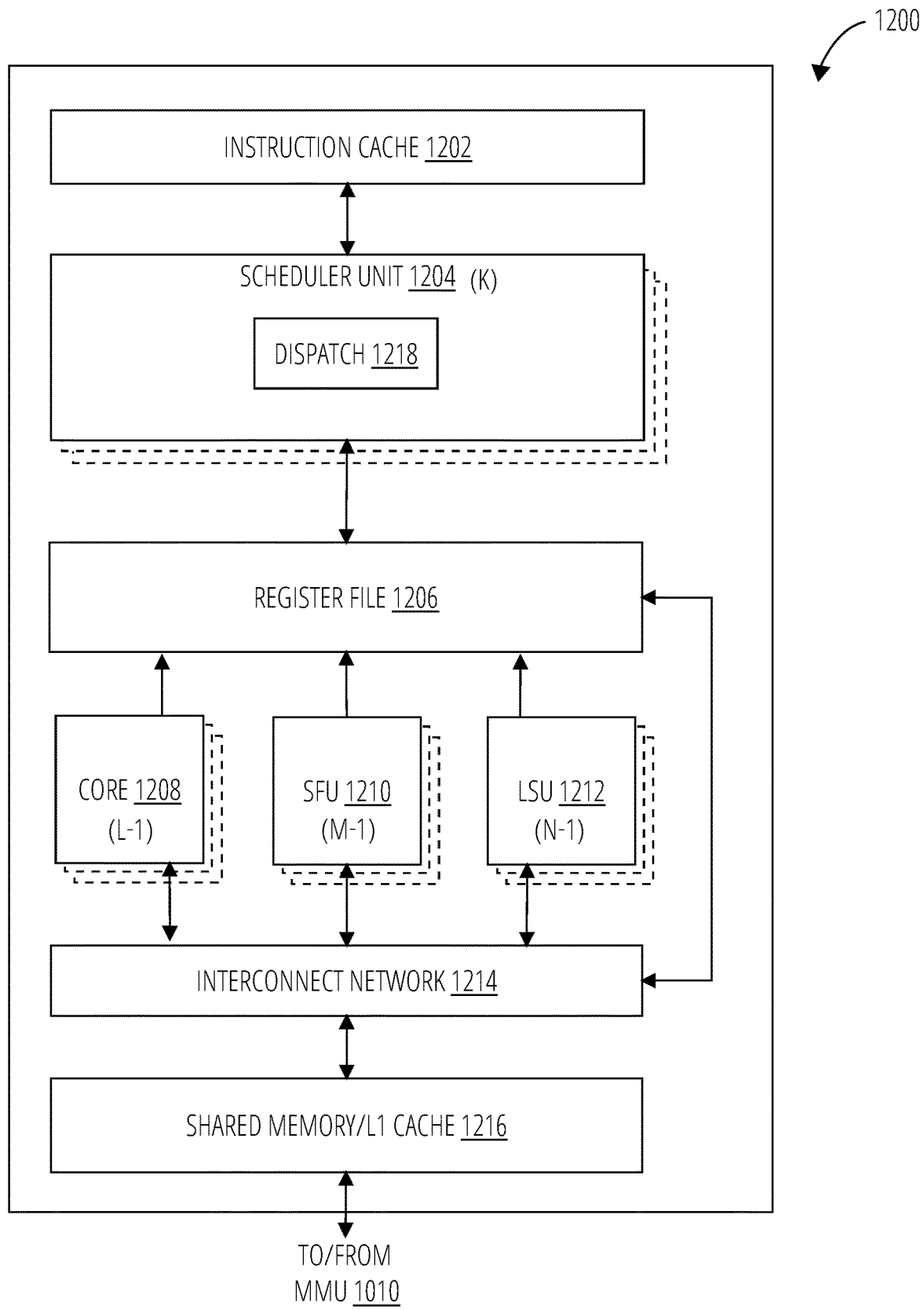
FIG. 12 depicts a streaming multiprocessor 1200 in accordance with one embodiment.

FIG. 12 illustrates the streaming multiprocessor 1200 of FIG. 10, in accordance with an embodiment. As shown in FIG. 12, the streaming multiprocessor 1200 includes an instruction cache 1202, one or more scheduler unit 1204 modules (e.g., such as scheduler unit 908), a register file 1206, one or more processing core 1208 modules, one or more special function unit 1210 modules, one or more load/store unit 1212 modules, an interconnect network 1214, and a shared memory/L1 cache 1216.

As described above, the work distribution unit 910 dispatches tasks for execution on the general processing cluster 1000 modules of the parallel processing unit 902. The tasks are allocated to a particular data processing cluster 1012 within a general processing cluster 1000 and, if the task is associated with a shader program, the task may be allocated to a streaming multiprocessor 1200. The scheduler unit 908 receives the tasks from the work distribution unit 910 and manages instruction scheduling for one or more thread blocks assigned to the streaming multiprocessor 1200. The scheduler unit 1204 schedules thread blocks for execution as warps of parallel threads, where each thread block is allocated at least one warp. In an embodiment, each warp executes 32 threads. The scheduler unit 1204 may manage a plurality of different thread blocks, allocating the warps to the different thread blocks and then dispatching instructions from the plurality of different cooperative groups to the various functional units (e.g., core 1208 modules, special function unit 1210 modules, and load/store unit 1212 modules) during each clock cycle.

Cooperative Groups is a programming model for organizing groups of communicating threads that allows developers to express the granularity at which threads are communicating, enabling the expression of richer, more efficient parallel decompositions. Cooperative launch APIs support synchronization amongst thread blocks for the execution of parallel algorithms. Conventional programming models provide a single, simple construct for synchronizing cooperating threads: a barrier across all threads of a thread block (e.g., the syncthreads( ) function). However, programmers would often like to define groups of threads at smaller than thread block granularities and synchronize within the defined groups to enable greater performance, design flexibility, and software reuse in the form of collective group-wide function interfaces.

Cooperative Groups enables programmers to define groups of threads explicitly at sub-block (e.g., as small as a single thread) and multi-block granularities, and to perform collective operations such as synchronization on the threads in a cooperative group. The programming model supports clean composition across software boundaries, so that libraries and utility functions can synchronize safely within their local context without having to make assumptions about convergence. Cooperative Groups primitives enable new patterns of cooperative parallelism, including producer-consumer parallelism, opportunistic parallelism, and global synchronization across an entire grid of thread blocks.

A dispatch 1218 unit is configured within the scheduler unit 1204 to transmit instructions to one or more of the functional units. In one embodiment, the scheduler unit 1204 includes two dispatch 1218 units that enable two different instructions from the same warp to be dispatched during each clock cycle. In alternative embodiments, each scheduler unit 1204 may include a single dispatch 1218 unit or additional dispatch 1218 units.

Each streaming multiprocessor 1200 includes a register file 1206 that provides a set of registers for the functional units of the streaming multiprocessor 1200. In an embodiment, the register file 1206 is divided between each of the functional units such that each functional unit is allocated a dedicated portion of the register file 1206. In another embodiment, the register file 1206 is divided between the different warps being executed by the streaming multiprocessor 1200. The register file 1206 provides temporary storage for operands connected to the data paths of the functional units.

Each streaming multiprocessor 1200 comprises L processing core 1208 modules. In an embodiment, the streaming multiprocessor 1200 includes a large number (e.g., 128, etc.) of distinct processing core 1208 modules. Each core 1208 may include a fully-pipelined, single-precision, double-precision, and/or mixed precision processing unit that includes a floating point arithmetic logic unit and an integer arithmetic logic unit. In an embodiment, the floating point arithmetic logic units implement the IEEE 754-2008 standard for floating point arithmetic. In an embodiment, the core 1208 modules include 64 single-precision (32-bit) floating point cores, 64 integer cores, 32 double-precision (64-bit) floating point cores, and 8 tensor cores.

Tensor cores configured to perform matrix operations, and, in an embodiment, one or more tensor cores are included in the core 1208 modules. In particular, the tensor cores are configured to perform deep learning matrix arithmetic, such as convolution operations for neural network training and inferencing. In an embodiment, each tensor core operates on a 4×4 matrix and performs a matrix multiply and accumulate operation D=A'B+C, where A, B, C, and D are 4×4 matrices.

In an embodiment, the matrix multiply inputs A and B are 16-bit floating point matrices, while the accumulation matrices C and D may be 16-bit floating point or 32-bit floating point matrices. Tensor Cores operate on 16-bit floating point input data with 32-bit floating point accumulation. The 16-bit floating point multiply requires 64 operations and results in a full precision product that is then accumulated using 32-bit floating point addition with the other intermediate products for a 4×4×4 matrix multiply. In practice, Tensor Cores are used to perform much larger two-dimensional or higher dimensional matrix operations, built up from these smaller elements. An API, such as CUDA 9 C++ API, exposes specialized matrix load, matrix multiply and accumulate, and matrix store operations to efficiently use Tensor Cores from a CUDA-C++ program. At the CUDA level, the warp-level interface assumes 16×16 size matrices spanning all 32 threads of the warp.

Each streaming multiprocessor 1200 also comprises M special function unit 1210 modules that perform special functions (e.g., attribute evaluation, reciprocal square root, and the like). In an embodiment, the special function unit 1210 modules may include a tree traversal unit configured to traverse a hierarchical tree data structure. In an embodiment, the special function unit 1210 modules may include texture unit configured to perform texture map filtering operations. In an embodiment, the texture units are configured to load texture maps (e.g., a 2D array of texels) from the memory 920 and sample the texture maps to produce sampled texture values for use in shader programs executed by the streaming multiprocessor 1200. In an embodiment, the texture maps are stored in the shared memory/L1 cache 1216. The texture units implement texture operations such as filtering operations using mip-maps (e.g., texture maps of varying levels of detail). In an embodiment, each streaming multiprocessor 1200 includes two texture units.

Each streaming multiprocessor 1200 also comprises N load/store unit 1212 modules that implement load and store operations between the shared memory/L1 cache 1216 and the register file 1206. Each streaming multiprocessor 1200 includes an interconnect network 1214 that connects each of the functional units to the register file 1206 and the load/store unit 1212 to the register file 1206 and shared memory/L1 cache 1216. In an embodiment, the interconnect network 1214 is a crossbar that can be configured to connect any of the functional units to any of the registers in the register file 1206 and connect the load/store unit 1212 modules to the register file 1206 and memory locations in shared memory/L1 cache 1216.

The shared memory/L1 cache 1216 is an array of on-chip memory that allows for data storage and communication between the streaming multiprocessor 1200 and the primitive engine 1014 and between threads in the streaming multiprocessor 1200. In an embodiment, the shared memory/L1 cache 1216 comprises 128 KB of storage capacity and is in the path from the streaming multiprocessor 1200 to the memory partition unit 1100. The shared memory/L1 cache 1216 can be used to cache reads and writes. One or more of the shared memory/L1 cache 1216, level two cache 1104, and memory 920 are backing stores.

Combining data cache and shared memory functionality into a single memory block provides the best overall performance for both types of memory accesses. The capacity is usable as a cache by programs that do not use shared memory. For example, if shared memory is configured to use half of the capacity, texture and load/store operations can use the remaining capacity. Integration within the shared memory/L1 cache 1216 enables the shared memory/L1 cache 1216 to function as a high-throughput conduit for streaming data while simultaneously providing high-bandwidth and low-latency access to frequently reused data.

When configured for general purpose parallel computation, a simpler configuration can be used compared with graphics processing. Specifically, the fixed function graphics processing units shown in FIG. 9, are bypassed, creating a much simpler programming model. In the general purpose parallel computation configuration, the work distribution unit 910 assigns and distributes blocks of threads directly to the data processing cluster 1012 modules. The threads in a block execute the same program, using a unique thread ID in the calculation to ensure each thread generates unique results, using the streaming multiprocessor 1200 to execute the program and perform calculations, shared memory/L1 cache 1216 to communicate between threads, and the load/store unit 1212 to read and write global memory through the shared memory/L1 cache 1216 and the memory partition unit 1100. When configured for general purpose parallel computation, the streaming multiprocessor 1200 can also write commands that the scheduler unit 908 can use to launch new work on the data processing cluster 1012 modules.

The parallel processing unit 902 may be included in a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, and the like. In an embodiment, the parallel processing unit 902 is embodied on a single semiconductor substrate. In another embodiment, the parallel processing unit 902 is included in a system-on-a-chip (SoC) along with one or more other devices such as additional parallel processing unit 902 modules, the memory 920, a reduced instruction set computer (RISC) CPU, a memory management unit (MMU), a digital-to-analog converter (DAC), and the like.

In an embodiment, the parallel processing unit 902 may be included on a graphics card that includes one or more memory devices. The graphics card may be configured to interface with a PCIe slot on a motherboard of a desktop computer. In yet another embodiment, the parallel processing unit 902 may be an integrated graphics processing unit (iGPU) or parallel processor included in the chipset of the motherboard.

Exemplary Computing System

Systems with multiple GPUs and CPUs are used in a variety of industries as developers expose and leverage more parallelism in applications such as artificial intelligence computing. High-performance GPU-accelerated systems with tens to many thousands of compute nodes are deployed in data centers, research facilities, and supercomputers to solve ever larger problems. As the number of processing devices within the high-performance systems increases, the communication and data transfer mechanisms need to scale to support the increased bandwidth.

Figure 13:
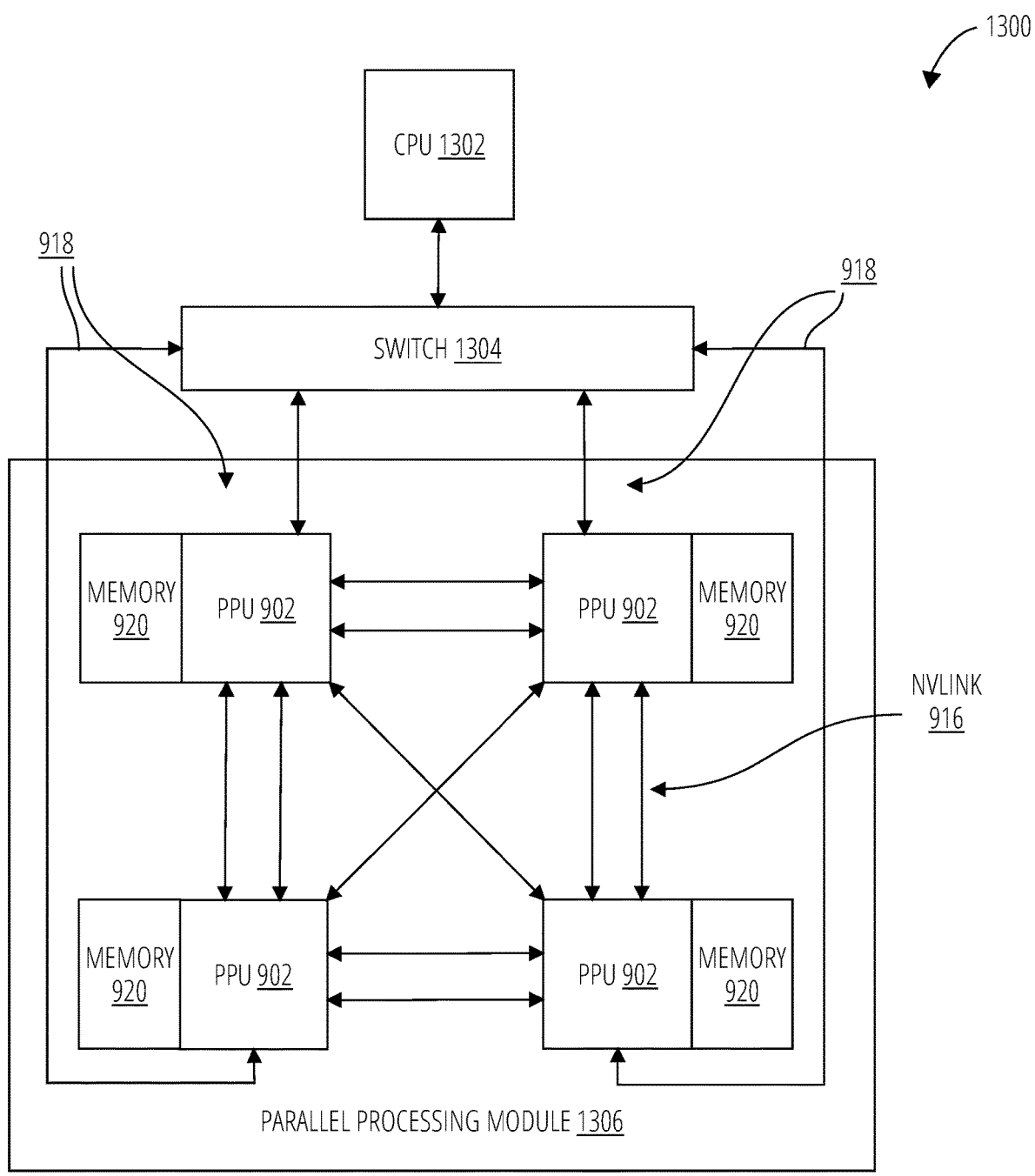
FIG. 13 depicts a processing system 1300 in accordance with one embodiment.

FIG. 13 is a conceptual diagram of a processing system 1300 implemented using the parallel processing unit 902 of FIG. 9, in accordance with an embodiment. The processing system 1300 includes a central processing unit 1302, switch 1304, and multiple parallel processing unit 902 modules each and respective memory 920 modules. The NVLink 916 provides high-speed communication links between each of the parallel processing unit 902 modules. Although a particular number of NVLink 916 and interconnect 918 connections are illustrated in FIG. 13, the number of connections to each parallel processing unit 902 and the central processing unit 1302 may vary. The switch 1304 interfaces between the interconnect 918 and the central processing unit 1302. The parallel processing unit 902 modules, memory 920 modules, and NVLink 916 connections may be situated on a single semiconductor platform to form a parallel processing module 1306. In an embodiment, the switch 1304 supports two or more protocols to interface between various different connections and/or links.

In another embodiment (not shown), the NVLink 916 provides one or more high-speed communication links between each of the parallel processing unit modules (parallel processing unit 902, parallel processing unit 902, parallel processing unit 902, and parallel processing unit 902) and the central processing unit 1302 and the switch 1304 interfaces between the interconnect 918 and each of the parallel processing unit modules. The parallel processing unit modules, memory 920 modules, and interconnect 918 may be situated on a single semiconductor platform to form a parallel processing module 1306. In yet another embodiment (not shown), the interconnect 918 provides one or more communication links between each of the parallel processing unit modules and the central processing unit 1302 and the switch 1304 interfaces between each of the parallel processing unit modules using the NVLink 916 to provide one or more high-speed communication links between the parallel processing unit modules. In another embodiment (not shown), the NVLink 916 provides one or more high-speed communication links between the parallel processing unit modules and the central processing unit 1302 through the switch 1304. In yet another embodiment (not shown), the interconnect 918 provides one or more communication links between each of the parallel processing unit modules directly. One or more of the NVLink 916 high-speed communication links may be implemented as a physical NVLink interconnect or either an on-chip or on-die interconnect using the same protocol as the NVLink 916.

In the context of the present description, a single semiconductor platform may refer to a sole unitary semiconductor-based integrated circuit fabricated on a die or chip. It should be noted that the term single semiconductor platform may also refer to multi-chip modules with increased connectivity which simulate on-chip operation and make substantial improvements over utilizing a conventional bus implementation. Of course, the various circuits or devices may also be situated separately or in various combinations of semiconductor platforms per the desires of the user. Alternately, the parallel processing module 1306 may be implemented as a circuit board substrate and each of the parallel processing unit modules and/or memory 920 modules may be packaged devices. In an embodiment, the central processing unit 1302, switch 1304, and the parallel processing module 1306 are situated on a single semiconductor platform.

In an embodiment, the signaling rate of each NVLink 916 is 20 to 25 Gigabits/second and each parallel processing unit module includes six NVLink 916 interfaces (as shown in FIG. 13, five NVLink 916 interfaces are included for each parallel processing unit module). Each NVLink 916 provides a data transfer rate of 25 Gigabytes/second in each direction, with six links providing 300 Gigabytes/second. The NVLink 916 can be used exclusively for PPU-to-PPU communication as shown in FIG. 13, or some combination of PPU-to-PPU and PPU-to-CPU, when the central processing unit 1302 also includes one or more NVLink 916 interfaces.

In an embodiment, the NVLink 916 allows direct load/store/atomic access from the central processing unit 1302 to each parallel processing unit module's memory 920. In an embodiment, the NVLink 916 supports coherency operations, allowing data read from the memory 920 modules to be stored in the cache hierarchy of the central processing unit 1302, reducing cache access latency for the central processing unit 1302. In an embodiment, the NVLink 916 includes support for Address Translation Services (ATS), enabling the parallel processing unit module to directly access page tables within the central processing unit 1302. One or more of the NVLink 916 may also be configured to operate in a low-power mode.

Figure 14:
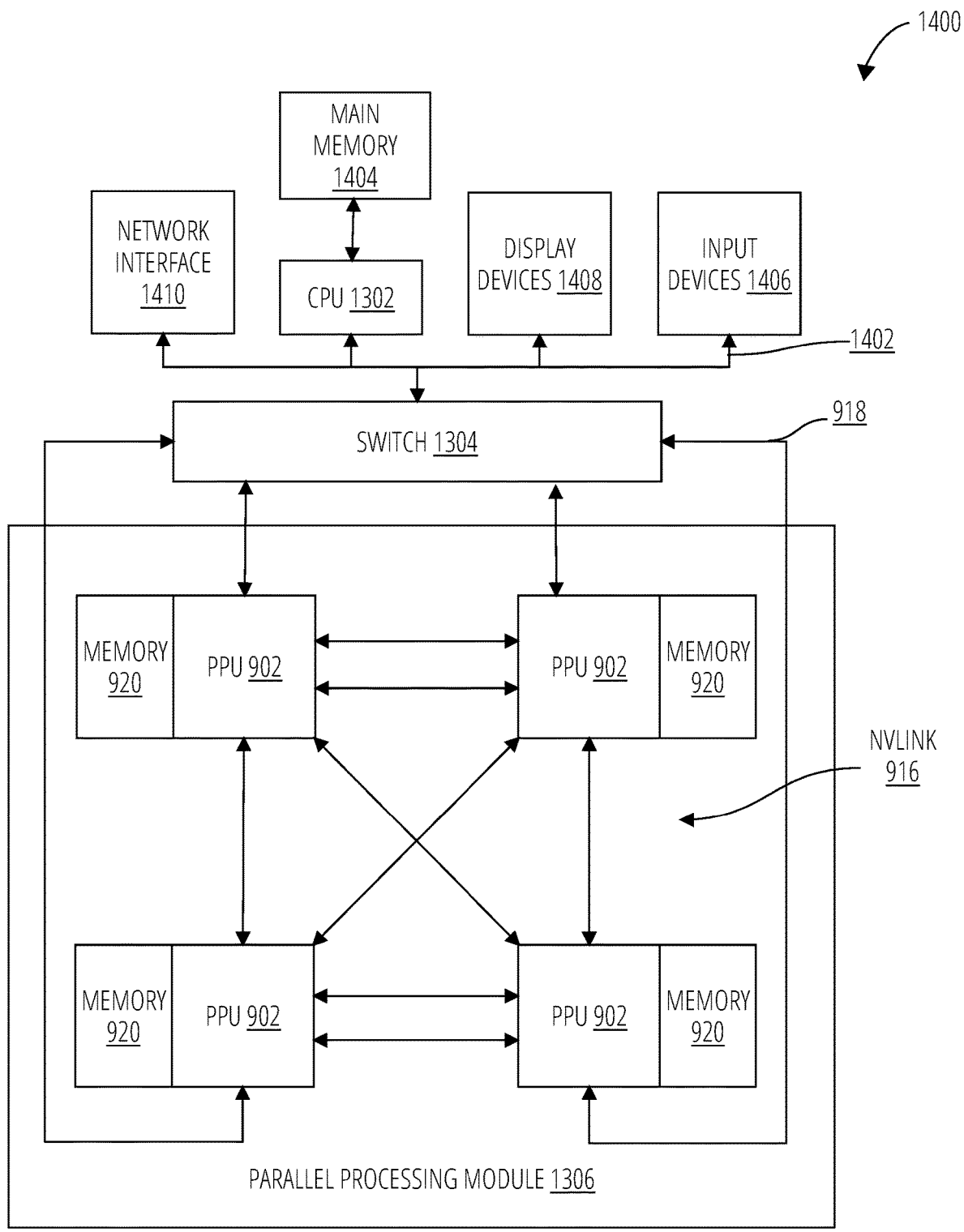
FIG. 14 depicts an exemplary processing system 1400 in accordance with another embodiment.

FIG. 14 depicts an exemplary processing system 1400 in which the various architecture and/or functionality of the various previous embodiments may be implemented. As shown, an exemplary processing system 1400 is provided including at least one central processing unit 1302 that is connected to a communications bus 1402. The communications bus 1402 may be implemented using any suitable protocol, such as PCI (Peripheral Component Interconnect), PCI-Express, AGP (Accelerated Graphics Port), HyperTransport, or any other bus or point-to-point communication protocol(s). The exemplary processing system 1400 also includes a main memory 1404. Control logic (software) and data are stored in the main memory 1404 which may take the form of random access memory (RAM).

The exemplary processing system 1400 also includes input devices 1406, the parallel processing module 1306, and display devices 1408, e.g. a conventional CRT (cathode ray tube), LCD (liquid crystal display), LED (light emitting diode), plasma display or the like. User input may be received from the input devices 1406, e.g., keyboard, mouse, touchpad, microphone, and the like. Each of the foregoing modules and/or devices may even be situated on a single semiconductor platform to form the exemplary processing system 1400. Alternately, the various modules may also be situated separately or in various combinations of semiconductor platforms per the desires of the user.

Further, the exemplary processing system 1400 may be coupled to a network (e.g., a telecommunications network, local area network (LAN), wireless network, wide area network (WAN) such as the Internet, peer-to-peer network, cable network, or the like) through a network interface 1410 for communication purposes.

The exemplary processing system 1400 may also include a secondary storage (not shown). The secondary storage includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 1404 and/or the secondary storage. Such computer programs, when executed, enable the exemplary processing system 1400 to perform various functions. The main memory 1404, the storage, and/or any other storage are possible examples of computer-readable media.

The architecture and/or functionality of the various previous figures may be implemented in the context of a general computer system, a circuit board system, a game console system dedicated for entertainment purposes, an application-specific system, and/or any other desired system. For example, the exemplary processing system 1400 may take the form of a desktop computer, a laptop computer, a tablet computer, servers, supercomputers, a smart-phone (e.g., a wireless, hand-held device), personal digital assistant (PDA), a digital camera, a vehicle, a head mounted display, a hand-held electronic device, a mobile phone device, a television, workstation, game consoles, embedded system, and/or any other type of logic.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

Graphics Processing Pipeline

Figure 15:
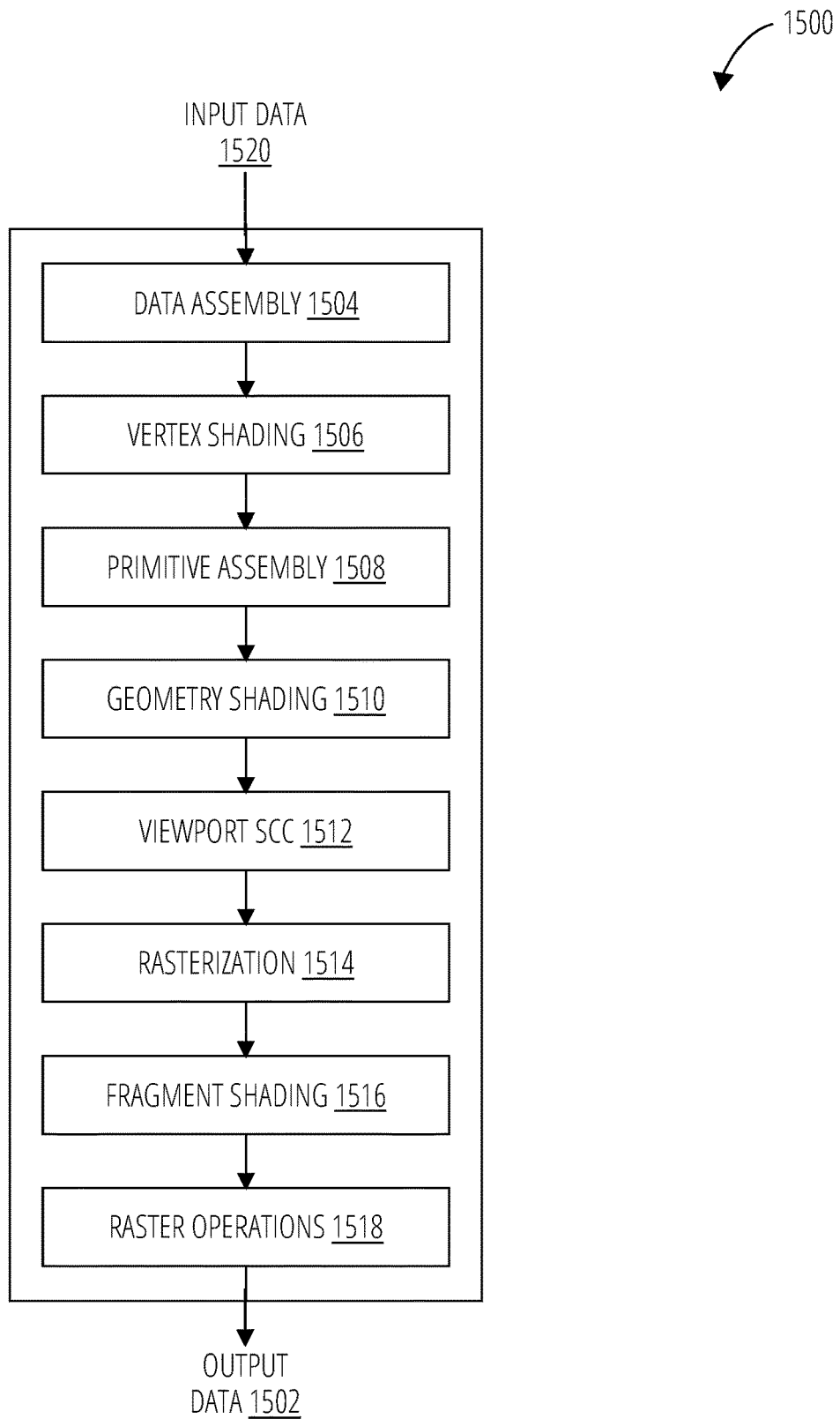
FIG. 15 depicts a graphics processing pipeline 1500 in accordance with one embodiment.

FIG. 15 is a conceptual diagram of a graphics processing pipeline 1500 implemented by the parallel processing unit 902 of FIG. 9, in accordance with an embodiment. In an embodiment, the parallel processing unit 902 comprises a graphics processing unit (GPU). The parallel processing unit 902 is configured to receive commands that specify shader programs for processing graphics data. Graphics data may be defined as a set of primitives such as points, lines, triangles, quads, triangle strips, and the like. Typically, a primitive includes data that specifies a number of vertices for the primitive (e.g., in a model-space coordinate system) as well as attributes associated with each vertex of the primitive. The parallel processing unit 902 can be configured to process the graphics primitives to generate a frame buffer (e.g., pixel data for each of the pixels of the display).

An application writes model data for a scene (e.g., a collection of vertices and attributes) to a memory such as a system memory or memory 920. The model data defines each of the objects that may be visible on a display. The application then makes an API call to the driver kernel that requests the model data to be rendered and displayed. The driver kernel reads the model data and writes commands to the one or more streams to perform operations to process the model data. The commands may reference different shader programs to be implemented on the streaming multiprocessor 1200 modules of the parallel processing unit 902 including one or more of a vertex shader, hull shader, domain shader, geometry shader, and a pixel shader. For example, one or more of the streaming multiprocessor 1200 modules may be configured to execute a vertex shader program that processes a number of vertices defined by the model data. In an embodiment, the different streaming multiprocessor 1200 modules may be configured to execute different shader programs concurrently. For example, a first subset of streaming multiprocessor 1200 modules may be configured to execute a vertex shader program while a second subset of streaming multiprocessor 1200 modules may be configured to execute a pixel shader program. The first subset of streaming multiprocessor 1200 modules processes vertex data to produce processed vertex data and writes the processed vertex data to the level two cache 1104 and/or the memory 920. After the processed vertex data is rasterized (e.g., transformed from three-dimensional data into two-dimensional data in screen space) to produce fragment data, the second subset of streaming multiprocessor 1200 modules executes a pixel shader to produce processed fragment data, which is then blended with other processed fragment data and written to the frame buffer in memory 920. The vertex shader program and pixel shader program may execute concurrently, processing different data from the same scene in a pipelined fashion until all of the model data for the scene has been rendered to the frame buffer. Then, the contents of the frame buffer are transmitted to a display controller for display on a display device.

The graphics processing pipeline 1500 is an abstract flow diagram of the processing steps implemented to generate 2D computer-generated images from 3D geometry data. As is well-known, pipeline architectures may perform long latency operations more efficiently by splitting up the operation into a plurality of stages, where the output of each stage is coupled to the input of the next successive stage. Thus, the graphics processing pipeline 1500 receives input data 601 that is transmitted from one stage to the next stage of the graphics processing pipeline 1500 to generate output data 1502. In an embodiment, the graphics processing pipeline 1500 may represent a graphics processing pipeline defined by the OpenGL® API. As an option, the graphics processing pipeline 1500 may be implemented in the context of the functionality and architecture of the previous Figures and/or any subsequent Figure(s).

As shown in FIG. 15, the graphics processing pipeline 1500 comprises a pipeline architecture that includes a number of stages. The stages include, but are not limited to, a data assembly 1504 stage, a vertex shading 1506 stage, a primitive assembly 1508 stage, a geometry shading 1510 stage, a viewport SCC 1512 stage, a rasterization 1514 stage, a fragment shading 1516 stage, and a raster operations 1518 stage. In an embodiment, the input data 1520 comprises commands that configure the processing units to implement the stages of the graphics processing pipeline 1500 and geometric primitives (e.g., points, lines, triangles, quads, triangle strips or fans, etc.) to be processed by the stages. The output data 1502 may comprise pixel data (e.g., color data) that is copied into a frame buffer or other type of surface data structure in a memory.

The data assembly 1504 stage receives the input data 1520 that specifies vertex data for high-order surfaces, primitives, or the like. The data assembly 1504 stage collects the vertex data in a temporary storage or queue, such as by receiving a command from the host processor that includes a pointer to a buffer in memory and reading the vertex data from the buffer. The vertex data is then transmitted to the vertex shading 1506 stage for processing.

The vertex shading 1506 stage processes vertex data by performing a set of operations (e.g., a vertex shader or a program) once for each of the vertices. Vertices may be, e.g., specified as a 4-coordinate vector (e.g., <x, y, z, w>) associated with one or more vertex attributes (e.g., color, texture coordinates, surface normal, etc.). The vertex shading 1506 stage may manipulate individual vertex attributes such as position, color, texture coordinates, and the like. In other words, the vertex shading 1506 stage performs operations on the vertex coordinates or other vertex attributes associated with a vertex. Such operations commonly including lighting operations (e.g., modifying color attributes for a vertex) and transformation operations (e.g., modifying the coordinate space for a vertex). For example, vertices may be specified using coordinates in an object-coordinate space, which are transformed by multiplying the coordinates by a matrix that translates the coordinates from the object-coordinate space into a world space or a normalized-device-coordinate (NCD) space. The vertex shading 1506 stage generates transformed vertex data that is transmitted to the primitive assembly 1508 stage.

The primitive assembly 1508 stage collects vertices output by the vertex shading 1506 stage and groups the vertices into geometric primitives for processing by the geometry shading 1510 stage. For example, the primitive assembly 1508 stage may be configured to group every three consecutive vertices as a geometric primitive (e.g., a triangle) for transmission to the geometry shading 1510 stage. In some embodiments, specific vertices may be reused for consecutive geometric primitives (e.g., two consecutive triangles in a triangle strip may share two vertices). The primitive assembly 1508 stage transmits geometric primitives (e.g., a collection of associated vertices) to the geometry shading 1510 stage.

The geometry shading 1510 stage processes geometric primitives by performing a set of operations (e.g., a geometry shader or program) on the geometric primitives. Tessellation operations may generate one or more geometric primitives from each geometric primitive. In other words, the geometry shading 1510 stage may subdivide each geometric primitive into a finer mesh of two or more geometric primitives for processing by the rest of the graphics processing pipeline 1500. The geometry shading 1510 stage transmits geometric primitives to the viewport SCC 1512 stage.

In an embodiment, the graphics processing pipeline 1500 may operate within a streaming multiprocessor and the vertex shading 1506 stage, the primitive assembly 1508 stage, the geometry shading 1510 stage, the fragment shading 1516 stage, and/or hardware/software associated therewith, may sequentially perform processing operations. Once the sequential processing operations are complete, in an embodiment, the viewport SCC 1512 stage may utilize the data. In an embodiment, primitive data processed by one or more of the stages in the graphics processing pipeline 1500 may be written to a cache (e.g. L1 cache, a vertex cache, etc.). In this case, in an embodiment, the viewport SCC 1512 stage may access the data in the cache. In an embodiment, the viewport SCC 1512 stage and the rasterization 1514 stage are implemented as fixed function circuitry.

The viewport SCC 1512 stage performs viewport scaling, culling, and clipping of the geometric primitives. Each surface being rendered to is associated with an abstract camera position. The camera position represents a location of a viewer looking at the scene and defines a viewing frustum that encloses the objects of the scene. The viewing frustum may include a viewing plane, a rear plane, and four clipping planes. Any geometric primitive entirely outside of the viewing frustum may be culled (e.g., discarded) because the geometric primitive will not contribute to the final rendered scene. Any geometric primitive that is partially inside the viewing frustum and partially outside the viewing frustum may be clipped (e.g., transformed into a new geometric primitive that is enclosed within the viewing frustum. Furthermore, geometric primitives may each be scaled based on a depth of the viewing frustum. All potentially visible geometric primitives are then transmitted to the rasterization 1514 stage.

The rasterization 1514 stage converts the 3D geometric primitives into 2D fragments (e.g. capable of being utilized for display, etc.). The rasterization 1514 stage may be configured to utilize the vertices of the geometric primitives to setup a set of plane equations from which various attributes can be interpolated. The rasterization 1514 stage may also compute a coverage mask for a plurality of pixels that indicates whether one or more sample locations for the pixel intercept the geometric primitive. In an embodiment, z-testing may also be performed to determine if the geometric primitive is occluded by other geometric primitives that have already been rasterized. The rasterization 1514 stage generates fragment data (e.g., interpolated vertex attributes associated with a particular sample location for each covered pixel) that are transmitted to the fragment shading 1516 stage.

The fragment shading 1516 stage processes fragment data by performing a set of operations (e.g., a fragment shader or a program) on each of the fragments. The fragment shading 1516 stage may generate pixel data (e.g., color values) for the fragment such as by performing lighting operations or sampling texture maps using interpolated texture coordinates for the fragment. The fragment shading 1516 stage generates pixel data that is transmitted to the raster operations 1518 stage.

The raster operations 1518 stage may perform various operations on the pixel data such as performing alpha tests, stencil tests, and blending the pixel data with other pixel data corresponding to other fragments associated with the pixel. When the raster operations 1518 stage has finished processing the pixel data (e.g., the output data 1502), the pixel data may be written to a render target such as a frame buffer, a color buffer, or the like.

It will be appreciated that one or more additional stages may be included in the graphics processing pipeline 1500 in addition to or in lieu of one or more of the stages described above. Various implementations of the abstract graphics processing pipeline may implement different stages. Furthermore, one or more of the stages described above may be excluded from the graphics processing pipeline in some embodiments (such as the geometry shading 1510 stage). Other types of graphics processing pipelines are contemplated as being within the scope of the present disclosure. Furthermore, any of the stages of the graphics processing pipeline 1500 may be implemented by one or more dedicated hardware units within a graphics processor such as parallel processing unit 902. Other stages of the graphics processing pipeline 1500 may be implemented by programmable hardware units such as the streaming multiprocessor 1200 of the parallel processing unit 902.

The graphics processing pipeline 1500 may be implemented via an application executed by a host processor, such as a CPU. In an embodiment, a device driver may implement an application programming interface (API) that defines various functions that can be utilized by an application in order to generate graphical data for display. The device driver is a software program that includes a plurality of instructions that control the operation of the parallel processing unit 902. The API provides an abstraction for a programmer that lets a programmer utilize specialized graphics hardware, such as the parallel processing unit 902, to generate the graphical data without requiring the programmer to utilize the specific instruction set for the parallel processing unit 902. The application may include an API call that is routed to the device driver for the parallel processing unit 902. The device driver interprets the API call and performs various operations to respond to the API call. In some instances, the device driver may perform operations by executing instructions on the CPU. In other instances, the device driver may perform operations, at least in part, by launching operations on the parallel processing unit 902 utilizing an input/output interface between the CPU and the parallel processing unit 902. In an embodiment, the device driver is configured to implement the graphics processing pipeline 1500 utilizing the hardware of the parallel processing unit 902.

Various programs may be executed within the parallel processing unit 902 in order to implement the various stages of the graphics processing pipeline 1500. For example, the device driver may launch a kernel on the parallel processing unit 902 to perform the vertex shading 1506 stage on one streaming multiprocessor 1200 (or multiple streaming multiprocessor 1200 modules). The device driver (or the initial kernel executed by the parallel processing unit 902) may also launch other kernels on the parallel processing unit 902 to perform other stages of the graphics processing pipeline 1500, such as the geometry shading 1510 stage and the fragment shading 1516 stage. In addition, some of the stages of the graphics processing pipeline 1500 may be implemented on fixed unit hardware such as a rasterizer or a data assembler implemented within the parallel processing unit 902. It will be appreciated that results from one kernel may be processed by one or more intervening fixed function hardware units before being processed by a subsequent kernel on a streaming multiprocessor 1200.

LISTING OF DRAWING ELEMENTS 100 memory cells
102 bit line
104 word line
106 full-selected cell
108 half-selected cell
200 six-transistor volatile memory cell
202 charge flow
300 word lines
302 pull-down transistor
400 word lines
402 inverter
404 charge flow
406 boundary discharge transistor
408 dummy transistor
602 suppressed region
700 word lines
800 word lines
902 parallel processing unit
904 I/O unit
906 front-end unit
908 scheduler unit
910 work distribution unit
912 hub
914 crossbar
916 NVLink
918 interconnect
920 memory
1000 general processing cluster
1002 pipeline manager
1004 pre-raster operations unit
1006 raster engine
1008 work distribution crossbar
1010 memory management unit
1012 data processing cluster
1014 primitive engine
1016 M-pipe controller
1100 memory partition unit
1102 raster operations unit
1104 level two cache
1106 memory interface
1200 streaming multiprocessor
1202 instruction cache
1204 scheduler unit
1206 register file
1208 core
1210 special function unit
1212 load/store unit
1214 interconnect network
1216 shared memory/L1 cache
1218 dispatch
1300 processing system
1302 central processing unit
1304 switch
1306 parallel processing module
1400 exemplary processing system
1402 communications bus
1404 main memory
1406 input devices
1408 display devices
1410 network interface
1500 graphics processing pipeline
1502 output data
1504 data assembly
1506 vertex shading
1508 primitive assembly
1510 geometry shading
1512 viewport SCC
1514 rasterization
1516 fragment shading
1518 raster operations
1520 input data Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A computer system comprising:
   a machine memory comprising a plurality of memory cells;
   a word line coupled to the memory cells, the word line comprising a word line driver; and
   the word line driver configured to discharge current through drivers of one or more non-adjacent word lines via a series arrangement of transistors coupled to a common gate control.

2. The computer system of claim 1, wherein the memory cells are six-transistor memory cells.

3. The computer system of claim 1, wherein the memory cells are eight-transistor memory cells.

4. The computer system of claim 1, wherein the word line driver comprises a PN inverter.

5. The computer system of claim 1, further comprising:
   a pair of boundary word lines; and
   an NMOS-PMOS pair of transistors coupled between each boundary word line and ground.

6. A method of operating a machine memory, the method comprising:
   asserting a word line to the memory; and
   discharging the current through a series arrangement of transistors coupling the word line to a plurality of non-adjacent other word lines, the series arrangement of transistors comprising a common gate control.

7. The method of claim 6, further comprising:
   discharging the current during an overlapping time interval of asserting the word line.

8. The method of claim 6, wherein the machine memory comprises six-transistor memory cells.

9. The method of claim 6, further comprising:
   discharging current from the word line through at least one other word line that is adjacent to the word line.

10. The method of claim 6, wherein the series arrangement of transistors comprises a first plurality of transistors comprising gates coupled to a first common control line and a second plurality of transistors comprising gates coupled to a second common control line.

11. The method of claim 10, wherein the first plurality of transistors are interleaved along the series arrangement with the second plurality of transistors.

12. A machine memory comprising:

a word line comprising a word line driver;

the word line driver configured to discharge current through a first adjacent word line via one of a plurality of first transistors connected to a same first gate control line; and the word line driver configured to discharge current through a second adjacent word line via one of a plurality of second transistors coupled to a same second gate control line.

13. The machine memory of claim 12, wherein the first transistors are connected in series with the second transistors.

14. The machine memory of claim 12, wherein the memory cells are six-transistor memory cells.

15. The machine memory of claim 12, wherein the word line drivers are inverters.

16. The machine memory of claim 15, wherein the inverters are PN inverters.

* * * * *